(12) United States Patent
No et al.

(10) Patent No.: US 11,574,599 B2
(45) Date of Patent: Feb. 7, 2023

(54) SCAN DRIVER AND DISPLAY DEVICE

(71) Applicant: Samsung Display Co., LTD., Yongin-si (KR)

(72) Inventors: Sang Yong No, Seoul (KR); Kwihyun Kim, Seongnam-si (KR); Hwa-Rang Lee, Suwon-si (KR); Jiyeon Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/574,864

(22) Filed: Jan. 13, 2022

(65) Prior Publication Data

US 2022/0383821 A1    Dec. 1, 2022

(30) Foreign Application Priority Data

May 27, 2021   (KR) ........................ 10-2021-0068556

(51) Int. Cl.
*G09G 3/3266*        (2016.01)
(52) U.S. Cl.
CPC ..... *G09G 3/3266* (2013.01); *G09G 2300/026* (2013.01); *G09G 2300/0842* (2013.01); *G09G 2310/08* (2013.01)
(58) Field of Classification Search
None
See application file for complete search history.

(56) References Cited

U.S. PATENT DOCUMENTS 5,471,070 A    11/1995 Shimada et al.
7,310,402 B2   12/2007 Wei et al.
7,663,575 B2    2/2010 Choi et al.
8,860,648 B2 * 10/2014 Lee ...................... G09G 3/3677
                                                345/204
8,957,882 B2 *  2/2015 Lee ........................ G11C 19/28
                                                345/204
9,818,353 B2   11/2017 So et al.
9,830,845 B2 * 11/2017 Lim ........................ G09G 3/20
                    (Continued)

FOREIGN PATENT DOCUMENTS

KR   10-2016-0000097      1/2016
KR   10-2016-0088469      7/2016
                    (Continued)

OTHER PUBLICATIONS

International Search Report, with English Translation, corresponding to International Application No. PCT/KR2022/007106 dated Aug. 18, 2022.

*Primary Examiner* — Sepehr Azari
(74) *Attorney, Agent, or Firm* — Kile Park Reed & Houtteman PLLC

(57) ABSTRACT

A scan driver includes active stages. Each active stage includes a first transistor that resets a control node, a second transistor that transfers a previous carry signal to the control node, a third transistor that transfers a scan clock signal to a scan output node, a first capacitor electrically connected between the control node and the scan output node, a fourth transistor that transfers a first low voltage to the scan output node, a fifth transistor that transfers a carry clock signal to a carry output node, a sixth transistor that electrically connects the control node to the carry output node, and a seventh transistor that transfers a second low voltage to the control node.

20 Claims, 16 Drawing Sheets

(56) References Cited

U.S. PATENT DOCUMENTS

| | | | |
|---|---|---|---|
| 10,847,082 B2 | 11/2020 | Kim | |
| 11,062,670 B2* | 7/2021 | Lee | G09G 3/3677 |
| 2012/0206437 A1* | 8/2012 | Kang | G09G 3/3614 |
| | | | 345/55 |
| 2016/0210928 A1* | 7/2016 | Cho | G11C 19/184 |
| 2017/0193949 A1 | 7/2017 | Kim | |

FOREIGN PATENT DOCUMENTS

| | | |
|---|---|---|
| KR | 10-2020-0023563 | 3/2020 |
| KR | 10-2020-0051896 | 5/2020 |

* cited by examiner

SCAN DRIVER AND DISPLAY DEVICE

CROSS-REFERENCE TO RELATED APPLICATION(S)

This application claims priority to and the benefit of Korean Patent Application No. 10-2021-0068556 under 35 U.S.C. § 119, filed on May 27, 2021, in the Korean Intellectual Property Office (KIPO), the entire contents of which are incorporated herein by reference.

BACKGROUND

1. Technical Field

Embodiments of the disclosure relate to a display device, and more specifically to a scan driver and a display device including the scan driver.

2. Description of the Related Art

A scan driver of a display device includes stages that outputs scan signals to pixel rows of a display panel. In general, the scan driver may be formed in a peripheral region adjacent to a display region of the display panel. Thus, a size of the peripheral region of the display panel, or a size of a dead space may be increased due to the scan driver. In a case where the scan driver is implemented as an oxide silicon gate (OSG) driver including n-type metal-oxide-semiconductor (NMOS) transistors, each stage of the scan driver may include a number of transistors (e.g., 28 to 31 transistors), and thus the size of the scan driver and the size of the dead space may be increased.

SUMMARY

Some embodiments provide a scan driver having a reduced size.

Some embodiments provide a display device including a scan driver having a reduced size.

According to embodiments, there is provided a scan driver including active stages.

Each of the active stages may include a first transistor that resets a control node in response to a frame start signal, a second transistor that transfers a previous carry signal to the control node, a third transistor that transfers a scan clock signal to a scan output node in response to a voltage of the control node, a first capacitor electrically connected between the control node and the scan output node, a fourth transistor that transfers a first low voltage to the scan output node in response to an inverted scan clock signal, a fifth transistor that transfers a carry clock signal to a carry output node in response to the voltage of the control node, a sixth transistor that electrically connects the control node to the carry output node in response to the carry clock signal, and a seventh transistor that transfers a second low voltage to the control node in response to a next carry signal.

In embodiments, the active stages may be disposed within a display region of a display panel that includes pixels.

In embodiments, each of the scan clock signal, the inverted scan clock signal, and the carry clock signal may have a duty ratio of about 50%.

In embodiments, each of the active stages may further include a second capacitor electrically connected between the control node and the carry output node, and the carry clock signal may lag the scan clock signal by a delay time.

In embodiments, a voltage level of the second low voltage may be lower than a voltage level of the first low voltage.

In embodiments, the first transistor may include a gate receiving the frame start signal, a first terminal electrically connected to the control node, and a second terminal receiving the second low voltage, the second transistor may include a gate receiving the previous carry signal, a first terminal electrically connected to the gate of the second transistor, and a second terminal electrically connected to the control node, the third transistor may include a gate electrically connected to the control node, a first terminal receiving the scan clock signal, and a second terminal electrically connected to the scan output node, the fourth transistor may include a gate receiving the inverted scan clock signal, a first terminal electrically connected to the scan output node, and a second terminal receiving the first low voltage, the fifth transistor may include a gate electrically connected to the control node, a first terminal receiving the carry clock signal, and a second terminal electrically connected to the carry output node, the sixth transistor may include a gate receiving the carry clock signal, a first terminal electrically connected to the control node, and a second terminal electrically connected to the carry output node, and the seventh transistor may include a gate receiving the next carry signal, a first terminal electrically connected to the control node, and a second terminal receiving the second low voltage.

In embodiments, each of the first, second, sixth, and seventh transistors may be implemented as a dual transistor including a first sub-transistor and a second sub-transistor, and each of the active stages may further include an eighth transistor that transfers a high voltage to a node between the first sub-transistor and the second sub-transistor of each of the first, second, sixth, and seventh transistors in response to the voltage of the control node.

In embodiments, a voltage level of the high voltage may be higher than a high level of the carry clock signal.

In embodiments, at least one of the first and second sub-transistors of each of the second, sixth, and seventh transistors may include a back gate, and a terminal of the at least one of the first and second sub-transistors may be electrically connected to the back gate.

In embodiments, each of the active stages may further include a sample and hold circuit that changes a voltage of a select node to a high level in response to a first control signal applied while a carry signal is output at the carry output node, and transfers the voltage of the select node to the control node in response to a second control signal applied in a blank period.

In embodiments, the sample and hold circuit may include a ninth transistor that transfers the second low voltage to the carry output node in response to the frame start signal, a tenth transistor that electrically connects the carry output node to the select node in response to the first control signal, the tenth transistor including a first sub-transistor and a second sub-transistor that are electrically connected in series, a third capacitor electrically connected between a line of a high voltage and the select node, an eleventh transistor that is turned on in response to the voltage of the select node, a twelfth transistor that receives the high voltage through the turned-on eleventh transistor, and transfers the received high voltage to the control node in response to the second control signal, and a thirteenth transistor that transfers the high voltage to a node between the first sub-transistor and the second sub-transistor in response to the voltage of the select node.

In embodiments, each of the active stages may further include an inverter circuit that outputs a voltage of an inverter node having a high level while the carry clock signal has a high level and the voltage of the control node has a low level, and a fourteenth transistor that transfers transfer the second low voltage to the carry output node in response to the voltage of the inverter node.

In embodiments, the inverter circuit may include a fifteenth transistor that transfers the carry clock signal to an internal node in response to the carry clock signal, a sixteenth transistor that transfers the carry clock signal to the inverter node in response to a voltage of the internal node, a seventeenth transistor that transfers the first low voltage to the internal node in response to the voltage of the control node, and an eighteenth transistor that transfers the first low voltage to the inverter node in response to the voltage of the control node.

In embodiments, the scan driver may further include at least one subsequent dummy stage located subsequent to the active stages. The subsequent dummy stage may include a nineteenth transistor that resets a control node of the subsequent dummy stage in response to the frame start signal, a twentieth transistor that transfers a first previous carry signal to the control node of the subsequent dummy stage, a twenty-first transistor that transfers the scan clock signal to a dummy scan output node in response to a voltage of the control node of the subsequent dummy stage, a fourth capacitor electrically connected between the control node of the subsequent dummy stage and the dummy scan output node, a twenty-second transistor that transfers the first low voltage to the dummy scan output node in response to the inverted scan clock signal, a fifth capacitor electrically connected between the dummy scan output node and a line of the first low voltage, a twenty-third transistor that transfers the carry clock signal to a carry output node of the subsequent dummy stage in response to the voltage of the control node of the subsequent dummy stage, a sixth capacitor electrically connected between the control node of the subsequent dummy stage and the carry output node of the subsequent dummy stage, a twenty-fourth transistor that electrically connects the control node of the subsequent dummy stage to the carry output node of the subsequent dummy stage in response to the carry clock signal, a twenty-fifth transistor that transfers the second low voltage to the control node of the subsequent dummy stage in response to a second control signal, a twenty-sixth transistor that transfers the second low voltage to the carry output node of the subsequent dummy stage in response to the frame start signal, a twenty-seventh transistor that transfers the second low voltage to the carry output node of the subsequent dummy stage in response to the second control signal, a twenty-eighth transistor that transfers the second low voltage to the carry output node of the subsequent dummy stage in response to a second previous carry signal, a twenty-ninth transistor that transfers the second low voltage to the control node of the subsequent dummy stage in response to a voltage of the carry output node of the subsequent dummy stage, and a thirtieth transistor that transfers the second low voltage to the control node of the subsequent dummy stage in response to a third previous carry signal.

In embodiments, each of the nineteenth, twentieth, twenty-fourth, twenty-fifth, twenty-ninth, and thirtieth transistors may be implemented as a dual transistor including a first sub-transistor and a second sub-transistor, and the subsequent dummy stage may further include a thirty-first transistor that transfers a high voltage to a node between the first sub-transistor and the second sub-transistor of each of the nineteenth, twentieth, twenty-fourth, twenty-fifth, twenty-ninth, and thirtieth transistors in response to the voltage of the control node of the subsequent dummy stage.

In embodiments, the scan driver may further include at least one previous dummy stage located previous to the active stages. The previous dummy stage may include a thirty-second transistor that transfers the frame start signal to a control node of the previous dummy stage, a thirty-third transistor that transfers the scan clock signal to a dummy scan output node in response to a voltage of the control node of the previous dummy stage, a seventh capacitor electrically connected between the control node of the previous dummy stage and the dummy scan output node, a thirty-fourth transistor that transfers the first low voltage to the dummy scan output node in response to the inverted scan clock signal, an eighth capacitor electrically connected between the dummy scan output node and a line of the first low voltage, a thirty-fifth transistor that transfers the carry clock signal to a carry output node of the previous dummy stage in response to the voltage of the control node of the previous dummy stage, a ninth capacitor electrically connected between the control node of the previous dummy stage and the carry output node of the previous dummy stage, a thirty-sixth transistor that electrically connects the control node of the previous dummy stage to the carry output node of the previous dummy stage in response to the carry clock signal, a thirty-seventh transistor that transfers the second low voltage to the control node of the previous dummy stage in response to a first next carry signal, and a thirty-eighth transistor that transfers the second low voltage to the carry output node of the previous dummy stage in response to the frame start signal.

In embodiments, each of the thirty-second, thirty-sixth, and thirty-seventh transistors may be implemented as a dual transistor including a first sub-transistor and a second sub-transistor, and the previous dummy stage may further include a thirty-ninth transistor that transfers a high voltage to a node between the first sub-transistor and the second sub-transistor of each of the thirty-second, thirty-sixth and thirty-seventh transistors in response to the voltage of the control node of the previous dummy stage.

According to embodiments, there is provided a display device including a display panel having a display region, and including pixels disposed in the display region, a scan driver including active stages that provides scan signals to the pixels, and a controller that provides scan clock signals, inverted scan clock signals, and carry clock signals to the scan driver. The active stages may be disposed within the display region. Each of the active stages may include a first transistor that resets a control node in response to a frame start signal, a second transistor that transfers a previous carry signal to the control node, a third transistor that transfers a corresponding scan clock signal of the scan clock signals to a scan output node in response to a voltage of the control node, a first capacitor electrically connected between the control node and the scan output node, a fourth transistor that transfers a first low voltage to the scan output node in response to a corresponding inverted scan clock signal of the inverted scan clock signals, a fifth transistor that transfers a corresponding carry clock signal of the carry clock signals to a carry output node in response to the voltage of the control node, a sixth transistor that electrically connects the control node to the carry output node in response to the corresponding carry clock signal, and a seventh transistor that transfers a second low voltage to the control node in response to a next carry signal.

In embodiments, the pixels may include first pixel circuits electrically connected to a first scan line, second pixel circuits electrically connected to a second scan line, third pixel circuits electrically connected to a third scan line, and fourth pixel circuits electrically connected to a fourth scan line. The first pixel circuits may be located in a first pixel row and odd-numbered pixel columns of pixel columns, the second pixel circuits are located in the first pixel row and even-numbered pixel columns of the pixel columns, the third pixel circuits are located in a second pixel row and the odd-numbered pixel columns, and the fourth pixel circuits are located in the second pixel row and the even-numbered pixel columns. A first active stage electrically connected to the first scan line among the active stages may be located in the first pixel row and first through K-th pixel columns of the pixel columns, where K is an integer greater than 1, a second active stage electrically connected to the second scan line among the active stages may be located in the first pixel row and K+1-th through 2K-th pixel columns of the pixel columns, a third active stage electrically connected to the third scan line among the active stages may be located in the second pixel row and 2K+1-th through 3K-th pixel columns of the pixel columns, and a fourth active stage electrically connected to the fourth scan line among the of active stages may be located in the second pixel row and 3K+1-th through 4K-th pixel columns of the pixel columns.

In embodiments, the scan clock signals may include first, second, third and fourth scan clock signals, the inverted scan clock signals may include first, second, third and fourth inverted scan clock signals, and the carry clock signals may include first, second, third, and fourth carry clock signals. 4L+1-th active stages of the active stages may receive the first scan clock signal, the first inverted scan clock signal, and the first carry clock signal, and may be located in first through K-th pixel columns of pixel columns, where L is an integer greater than or equal to 0, and K is an integer greater than 1. 4L+2-th active stages of the active stages may receive the second scan clock signal, the second inverted scan clock signal and the second carry clock signal, and may be located in K+1-th through 2K-th pixel columns of the pixel columns. 4L+3-th active stages of the active stages may receive the third scan clock signal, the third inverted scan clock signal and the third carry clock signal, and may be located in 2K+1-th through 3K-th pixel columns of the pixel columns. 4L+4-th active stages of the active stages may receive the fourth scan clock signal, the fourth inverted scan clock signal and the fourth carry clock signal, and may be located in 3K+1-th through 4K-th pixel columns of the pixel columns.

As described above, in a scan driver and a display device according to embodiments, each active stage may include first through seventh transistors and a first capacitor. Thus, the number of transistors included in the active stage of the scan driver according to embodiments may be reduced compared with the number of transistors included in a stage of a conventional scan driver, and a size of the scan driver according to embodiments may be reduced compared with a size of the conventional scan driver. Further, since the active stage includes the reduced number of transistors, in some embodiments, the scan driver may be formed within a display region of a display panel.

BRIEF DESCRIPTION OF THE DRAWINGS

Illustrative, non-limiting embodiments will be more clearly understood from the following detailed description in conjunction with the accompanying drawings.

DETAILED DESCRIPTION OF EMBODIMENTS

Figure 1:
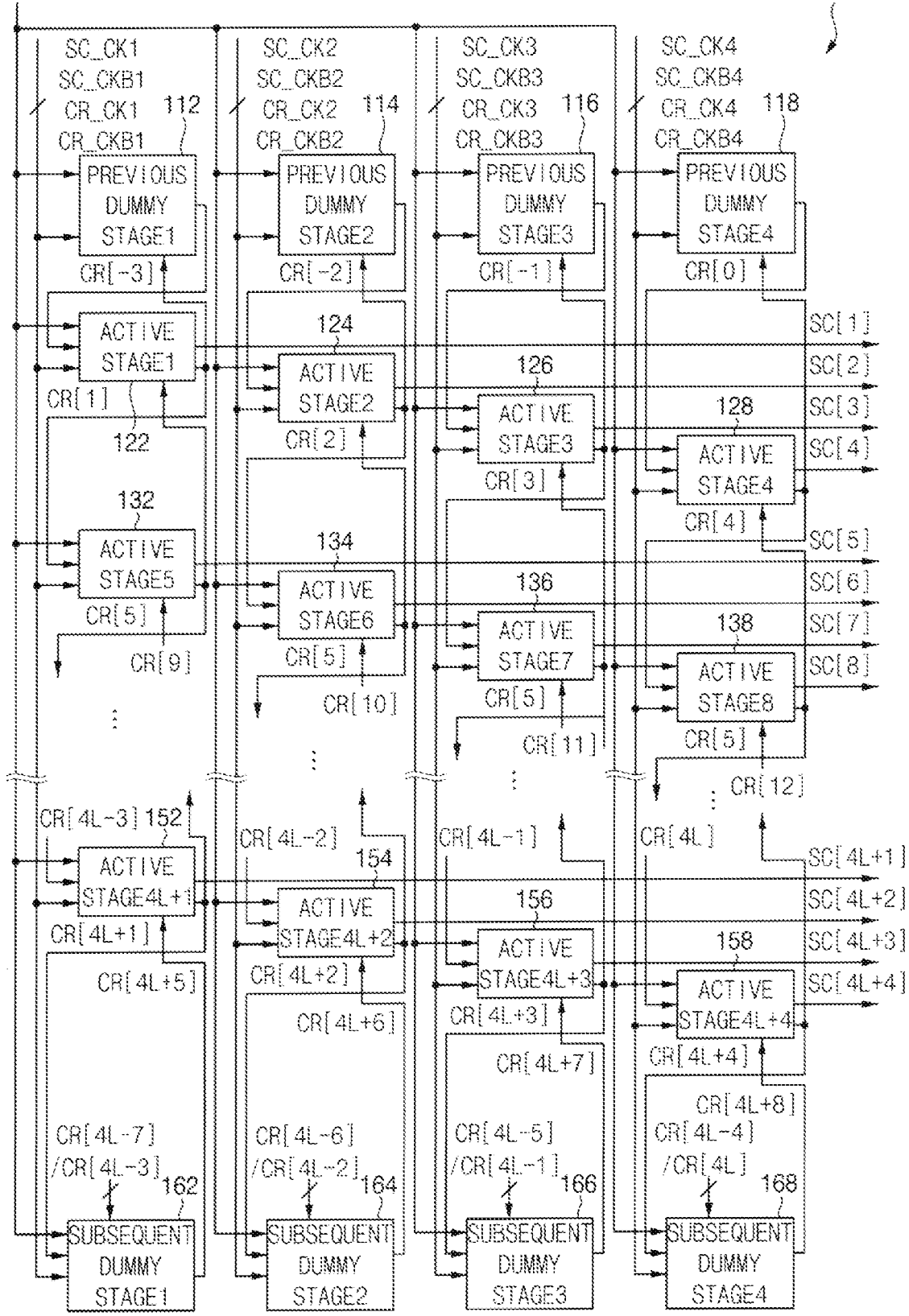
FIG. 1 is a schematic block diagram illustrating a scan driver according to embodiments.

The embodiments are described more fully hereinafter with reference to the accompanying drawings. Like or similar reference numerals refer to like or similar elements throughout.

It will be understood that the terms "contact," "connected to," and "coupled to" may include a physical and/or electrical contact, connection, or coupling.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 2:
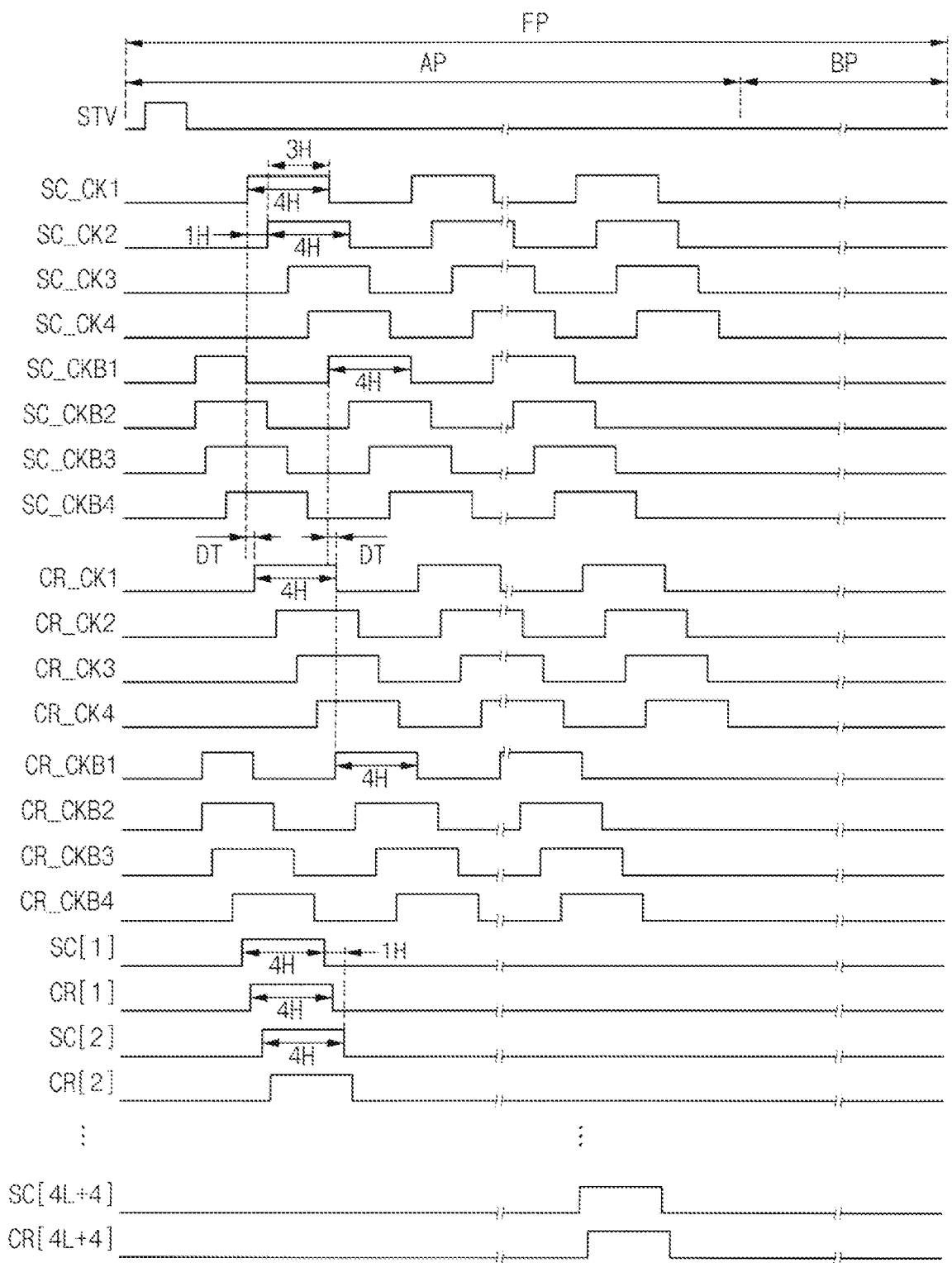
FIG. 2 is a schematic timing diagram for describing an example of an operation of a scan driver of FIG. 1 during a frame period.
Figure 3:
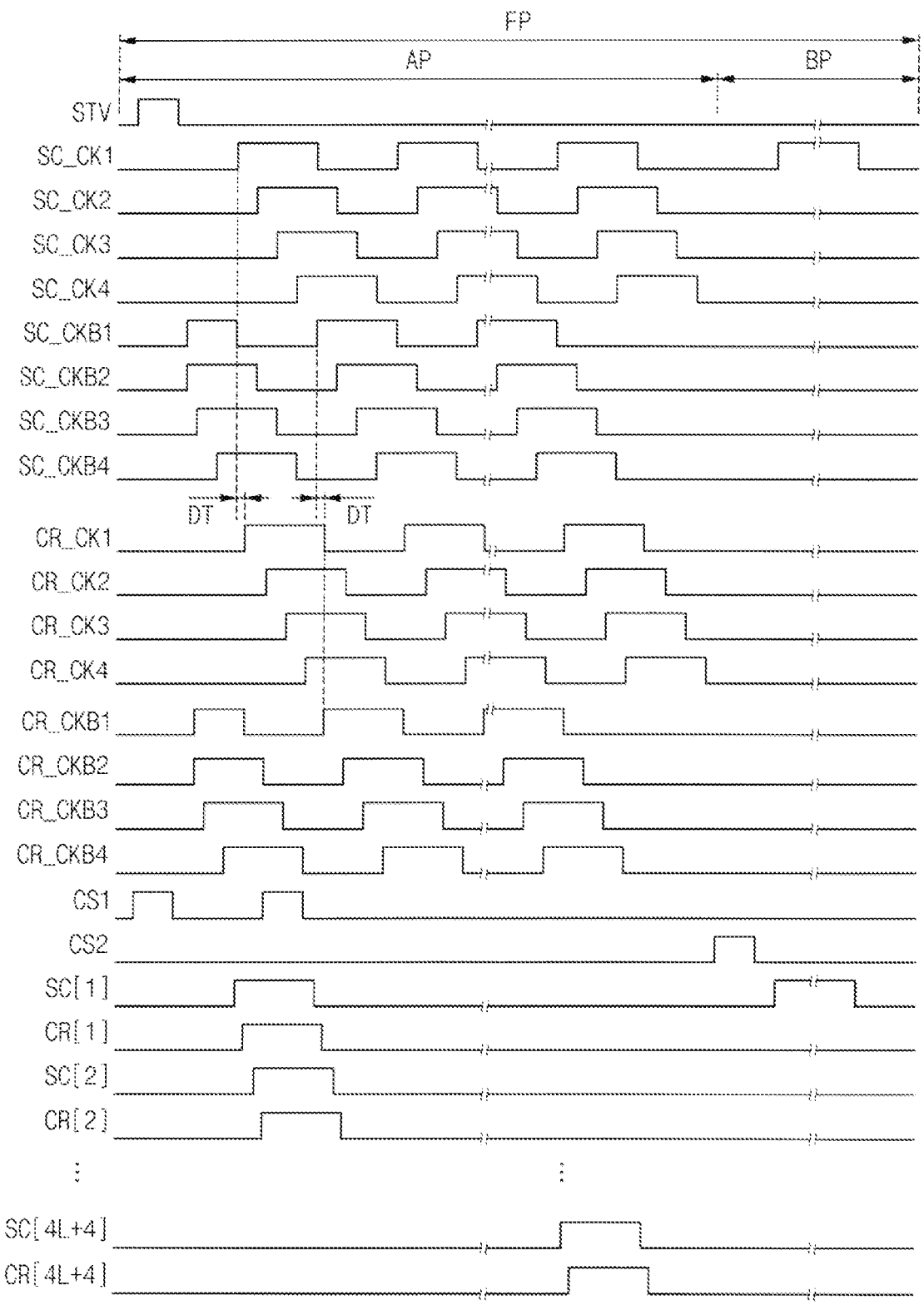
FIG. 3 is a schematic timing diagram for describing another example of an operation of a scan driver of FIG. 1 during a frame period.
Figure 4:
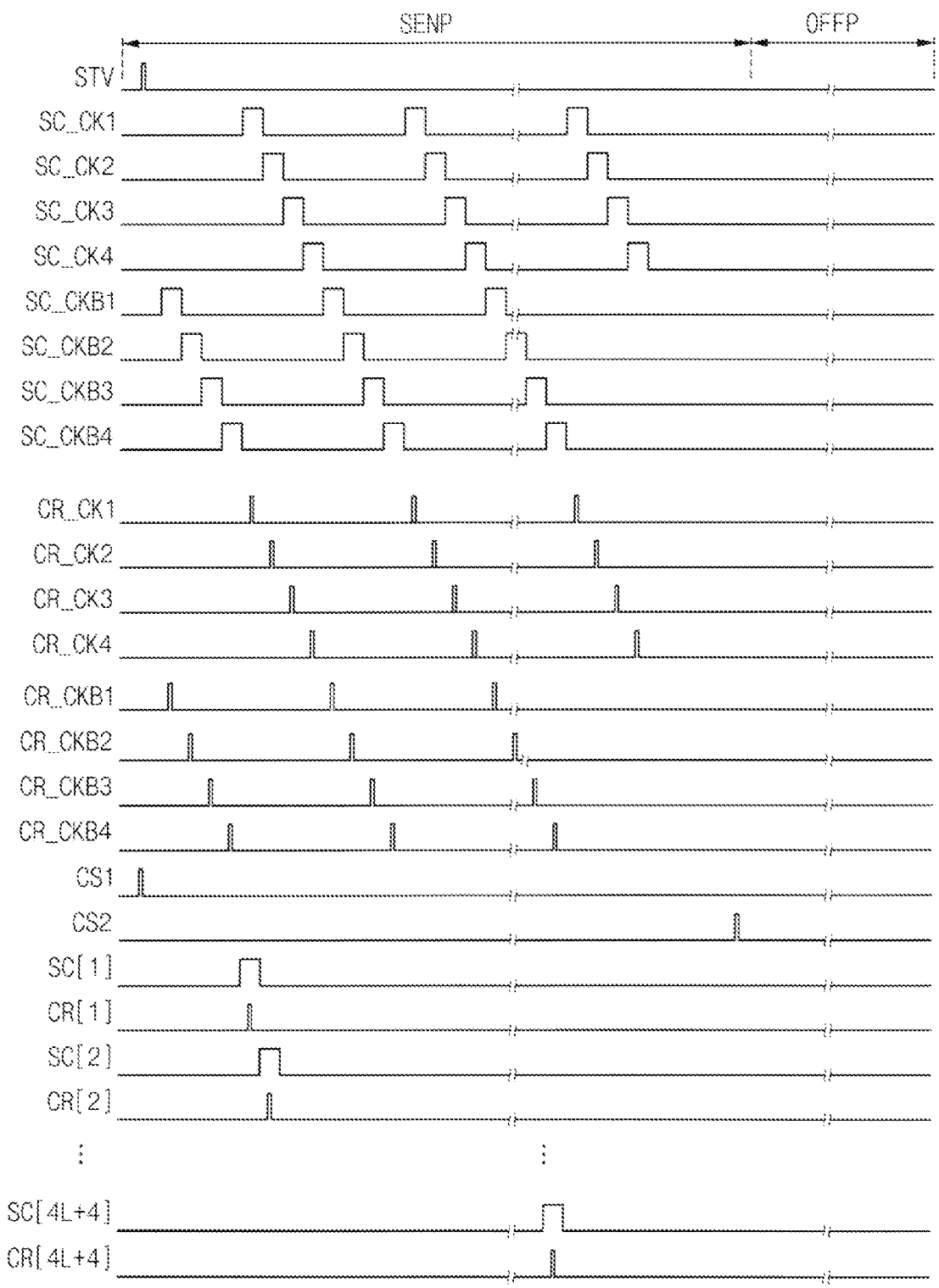
FIG. 4 is a schematic timing diagram for describing an example of an operation of a scan driver of FIG. 1 before a power-off of a display device.

FIG. 1 is a schematic block diagram illustrating a scan driver according to embodiments, FIG. 2 is a schematic timing diagram for describing an example of an operation of the scan driver of FIG. 1 during a frame period, FIG. 3 is a schematic timing diagram for describing another example of an operation of the scan driver of FIG. 1 during a frame period, and FIG. 4 is a schematic timing diagram for describing an example of an operation of the scan driver of FIG. 1 before a power-off of a display device.

Referring to FIG. 1, a scan driver 100 according to embodiments may include active stages 122, 124, 126, 128, 132, 134, 136, 138, . . . , 152, 154, 156, and 158 that respectively output scan signals SC[1] to SC[8] and SC[4L+1] to SC[4L+4]. In some embodiments, the scan driver 100 may further include at least one previous dummy stage 112, 114, 116, and 118 located previous to the active stages 122 to 158, and/or at least one subsequent dummy stage 162, 164, 166 and 168 located subsequent to the active stages 122 to 158. For example, the scan driver 100 may include first, second, third, and fourth previous dummy stages 112, 114, 116, and 118, first to (4L+4)-th active stages 122 to 158, and first, second, third and fourth subsequent dummy stages 162, 164, 166 and 168, where L is an integer greater than 0.

The subsequent dummy stages 162, 164, 166 and 168, the active stages 122 to 158 and the subsequent dummy stages 162, 164, 166, and 168 may receive a frame start signal STV, scan clock signals SC_CK1 to SC_CK4, inverted scan clock signals SC_CKB1 to SC_CKB4, carry clock signals CR_CK1 to CR_CK4, and inverted carry clock signals CR_CKB1 to CR_CKB4. In some embodiments, the active stages 122 to 158 may further receive a first control signal CS1 and a second control signal CS2, and the subsequent dummy stages 162, 164, 166 and 168 may further receive the second control signal CS2.

In some embodiments, as illustrated in FIG. 1, the first previous dummy stage 112, the first, fifth, . . . , and (4L+1)-th active stages 122, 132, . . . , and 152 and the first subsequent dummy stage 162 may receive a first scan clock signal SC_CK1, a first inverted scan clock signal SC_CKB1, a first carry clock signal CR_CK1, and a first inverted carry clock signal CR_CKB1, the second previous dummy stage 114, the second, sixth, . . . , and (4L+2)-th active stages 124, 134, . . . , and 154 and the second subsequent dummy stage 164 may receive a second scan clock signal SC_CK2, a second inverted scan clock signal SC_CKB2, a second carry clock signal CR_CK2, and a second inverted carry clock signal CR_CKB2, the third previous dummy stage 116, the third, seventh, . . . , and (4L+3)-th active stages 126, 136, . . . , and 156 and the third subsequent dummy stage 166 may receive a third scan clock signal SC_CK3, a third inverted scan clock signal SC_CKB3, a third carry clock signal CR_CK3, and a third inverted carry clock signal CR_CKB3, and the fourth previous dummy stage 118, the fourth, eighth, . . . , and (4L+4)-th active stages 128, 138, . . . , and 158 and the fourth subsequent dummy stage 168 may receive a fourth scan clock signal SC_CK4, a fourth inverted scan clock signal SC_CKB4, a fourth carry clock signal CR_CK4, and a fourth inverted carry clock signal CR_CKB4.

Each active stage (e.g., a first active stage 122) may reset or discharge a control node of the active stage (e.g., a first active stage 122) based on the frame start signal STV, may charge the control node based on a previous carry signal (e.g., a (−3)-rd carry signal CR[−3]), may output a scan signal (e.g., a first scan signal SC[1]) based on a scan clock signal (e.g., a first scan clock signal SC_CK1) and an inverted scan signal (e.g., a first inverted scan signal SC_CKB1) while the control node is in a charged state, and may output a carry signal (e.g., a first carry signal CR[1]) based on a carry clock signal (e.g., a first carry clock signal CR_CK1) while the control node is in the charged state. Further, each active stage (e.g., a first active stage 122) may discharge the control node based on a next carry signal (e.g., a fifth carry signal CR[5]).

For example, a portion (e.g., 122, . . . ) of the first, fifth, . . . , and (4L+1)-th active stages 122, 132, . . . , and 152 may receive the first scan clock signal SC_CK1, the first inverted scan clock signal SC_CKB1, and the first carry clock signal CR_CK1 as the scan clock signal, the inverted scan clock signal, and the carry clock signal, respectively, and another or remaining portion (e.g., 132, . . . , and 152) of the first, fifth, . . . , and (4L+1)-th active stages 122, 132, . . . , and 152 may receive the first inverted scan clock signal SC_CKB1, the first scan clock signal SC_CK1, and the first inverted carry clock signal CR_CKB1 as the scan clock signal, the inverted scan clock signal, and the carry clock signal, respectively. Further, a portion (e.g., 124, . . . ) of the second, sixth, . . . , and (4L+2)-th active stages 124, 134, . . . , and 154 may receive the second scan clock signal SC_CK2, the second inverted scan clock signal SC_CKB2, and the second carry clock signal CR_CK2 as the scan clock signal, the inverted scan clock signal and the carry clock signal, respectively, and another or remaining portion (e.g., 134, . . . , and 154) of the second, sixth, . . . , and (4L+2)-th active stages 124, 134, . . . , and 154 may receive the second inverted scan clock signal SC_CKB2, the second scan clock signal SC_CK2, and the second inverted carry clock signal CR_CKB2 as the scan clock signal, the inverted scan clock signal, and the carry clock signal, respectively. Further, a portion (e.g., 126, . . . ) of the third, seventh, . . . , and (4L+3)-th active stages 126, 136, . . . , and 156 may receive the third scan clock signal SC_CK3, the third inverted scan clock signal SC_CKB3, and the third carry clock signal CR_CK3 as the scan clock signal, the inverted scan clock signal, and the carry clock signal, respectively, and another or remaining portion (e.g., 136, . . . , and 156) of the third, seventh, . . . , and (4L+3)-th active stages 126, 136, . . . , and 156 may receive the third inverted scan clock signal SC_CKB3, the third scan clock signal SC_CK3, and the third inverted carry clock signal CR_CKB3 as the scan clock signal, the inverted scan clock signal, and the carry clock signal, respectively. Further, a portion (e.g., 128, . . . ) of the fourth, eighth, . . . , and (4L+4)-th active stages 128, 138, . . . , and 158 may receive the fourth scan clock signal SC_CK4, the fourth inverted scan clock signal SC_CKB4, and the fourth carry clock signal CR_CK4 as the scan clock signal, the inverted scan clock signal, and the carry clock signal, respectively, and another or remaining portion (e.g., 138, . . . , and 158) of the fourth, eighth, . . . , and (4L+4)-th active stages 128, 138, . . . , and 158 may receive the fourth inverted scan clock signal SC_CKB4, the fourth scan clock signal SC_CK4, and the fourth inverted carry clock signal CR_CKB4 as the scan clock signal, the inverted scan clock signal, and the carry clock signal, respectively.

Further, for example, the first, second, third, and fourth active stages 122, 124, 126 and 128 may receive (−3)-rd, (−2)-nd, (−1)-st, and (0)-th carry signals CR[−3], CR[−2], CR[−1], and CR[0] as the previous carry signal, respectively, may output first, second, third, and fourth scan signals SC[1], SC[2], SC[3], and SC[4] as the scan signal, respectively, may output first, second, third, and fourth carry signals CR[1], CR[2], CR[3], and CR[4] as the carry signal, respectively, and may receive fifth, sixth, seventh, and eighth carry signals CR[5], CR[6], CR[7], and CR[8] as the next carry signal, respectively. Further, the fifth, sixth, seventh, and eighth active stages 132, 134, 136, and 138 may receive the first, second, third, and fourth carry signals CR[1], CR[2], CR[3], and CR[4] as the previous carry signal, respectively, may output fifth, sixth, seventh, and eighth scan signals SC[5], SC[6], SC[7], and SC[8] as the scan signal, respectively, may output fifth, sixth, seventh, and eighth carry signals CR[5], CR[6], CR[7], and CR[8] as the carry signal, respectively, and may receive ninth, tenth, eleventh, and twelfth carry signals CR[9], CR[10], CR[11], and CR[12] as the next carry signal, respectively. In this manner, the (4L+1)-th, (4L+2)-th, (4L+3)-th, and (4L+4)-th active stages 152, 154, 156, and 158 may receive (4L−3)-th, (4L−2)-th, (4L−1)-th, and 4L-th carry signals CR[4L−3], CR[4L−2], CR[4L−1], and CR[4L] as the previous carry signal, respectively, may output (4L+1)-th, (4L+2)-th, (4L+3)-th, and (4L+4)-th scan signals SC[4L+1], SC[4L+2], SC[4L+3], and SC[4L+4] as the scan signal, respectively, may output (4L+1)-th, (4L+2)-th, (4L+3)-th, and (4L+4)-th carry signals CR[4L+1], CR[4L+2], CR[4L+3], and CR[4L+4] as the carry signal, respectively, and may receive (4L+5)-th, (4L+6)-th, (4L+7)-th, and (4L+8)-th carry signals CR[4L+5], CR[4L+6], CR[4L+7], and CR[4L+8] as the next carry signal, respectively.

In some embodiments, the first, second, third, and fourth previous dummy stages 112, 114, 116, and 118 may generate the (−3)-rd, (−2)-nd, (−1)-st, and (0)-th carry signals CR[−3], CR[−2], CR[−1], and CR[0] as the previous carry signals of the first, second, third, and fourth active stages 122, 124, 126, and 128, and the first, second, third, and fourth subsequent dummy stages 162, 164, 166, and 168 may generate the (4L+5)-th, (4L+6)-th, (4L+7)-th, and (4L+8)-th carry signals CR[4L+5], CR[4L+6], CR[4L+7], and CR[4L+8] as the next carry signals of the (4L+1)-th, (4L+2)-th, (4L+3)-th, and (4L+4)-th active stages 152, 154, 156, and 158.

For example, the first, second, third, and fourth previous dummy stages 112, 114, 116, and 118 may receive the first, second, third, and fourth inverted scan clock signals SC_CKB1, SC_CKB2, SC_CKB3, and SC_CKB4 as the scan clock signal, respectively, may receive the first, second, third, and fourth scan clock signals SC_CK1, SC_CK2, SC_CK3, and SC_CK4 as the inverted scan clock signal, respectively, may receive the first, second, third, and fourth inverted carry clock signals CR_CKB1, CR_CKB2, CR_CKB3, and CR_CKB4 as the carry clock signal, respectively, and may output the (−3)-rd, (−2)-nd, (−1)-st, and (0)-th carry signals CR[−3], CR[−2], CR[−1], and CR[0] based on the carry clock signal, respectively. Further, the first, second, third, and fourth previous dummy stages 112, 114, 116, and 118 may receive the first, second, third, and fourth carry signals CR[1], CR[2], CR[3], and CR[4] as the next carry signal, respectively.

Further, for example, the first, second, third, and fourth subsequent dummy stages 162, 164, 166, and 168 may receive the first, second, third, and fourth scan clock signals SC_CK1, SC_CK2, SC_CK3, and SC_CK4 as the scan clock signal, respectively, may receive the first, second, third, and fourth inverted scan clock signals SC_CKB1, SC_CKB2, SC_CKB3, and SC_CKB4 as the inverted scan clock signal, respectively, may receive the first, second, third, and fourth carry clock signals CR_CK1, CR_CK2, CR_CK3, and CR_CK4 as the carry clock signal, respectively, and may output the (4L+5)-th, (4L+6)-th, (4L+7)-th, and (4L+8)-th carry signals CR[4L+5], CR[4L+6], CR[4L+7], and CR[4L+8] based on the carry clock signal, respectively. Further, the first subsequent dummy stage 162 may receive (4L−7)-th, (4L−3)-th, and (4L+1)-th carry signals CR[4L−7], CR[4L−3], and CR[4L+1] as previous carry signals, the second subsequent dummy stage 164 may receive (4L−6)-th, (4L−2)-th, and (4L+2)-th carry signals CR[4L−6], CR[4L−2], and CR[4L+2] as previous carry signals, the third subsequent dummy stage 166 may receive (4L−5)-th, (4L−1)-th, and (4L+3)-th carry signals CR[4L−5], CR[4L−1], and CR[4L+3] as previous carry signals, and the fourth subsequent dummy stage 168 may receive (4L−4)-th, 4L-th, and (4L+4)-th carry signals CR[4L−4], CR[4L], and CR[4L+4] as previous carry signals.

Hereinafter, an example of a normal operation of the scan driver 100 will be described below with reference to FIGS. 1 and 2.

As illustrated in FIG. 2, a frame period FP may include an active period AP and a blank period BP, and the frame start signal STV may be provided at a start time point of the frame period FP. The first, second, third, and fourth previous dummy stages 112, 114, 116, and 118 may charge control nodes of the first, second, third, and fourth previous dummy stages 112, 114, 116, and 118 based on the frame start signal STV Further, the first to (4L+4)-th active stages 122 to 158 and the first, second, third, and fourth subsequent dummy stages 162, 164, 166, and 168 may reset or discharge control nodes of the first to (4L+4)-th active stages 122 to 158 and the first, second, third, and fourth subsequent dummy stages 162, 164, 166, and 168 based on the frame start signal STV.

In the active period AP, the first, second, third, and fourth scan clock signals SC_CK1, SC_CK2, SC_CK3, and SC_CK4, the first, second, third, and fourth inverted scan clock signals SC_CKB1, SC_CKB2, SC_CKB3, and SC_CKB4, the first, second, third, and fourth carry clock signals CR_CK1, CR_CK2, CR_CK3, and CR_CK4, and the first, second, third, and fourth inverted carry clock signals CR_CKB1, CR_CKB2, CR_CKB3, and CR_CKB4 may periodically toggle between a high level and a low level. In some embodiments, as illustrated in FIG. 2, each of the first, second, third, and fourth scan clock signals SC_CK1, SC_CK2, SC_CK3, and SC_CK4, the first, second, third, and fourth inverted scan clock signals SC_CKB1, SC_CKB2, SC_CKB3, and SC_CKB4, the first, second, third, and fourth carry clock signals CR_CK1, CR_CK2, CR_CK3, and CR_CK4, and the first, second, third, and fourth inverted carry clock signals CR_CKB1, CR_CKB2, CR_CKB3, and CR_CKB4 may have, but is not limited to, a duty ratio of about 50%. In other embodiments, each clock signal may have a duty ratio of about 25%, a duty ratio of about 12.5%, or the like. Further, the first, second, third, and fourth scan clock signals SC_CK1, SC_CK2, SC_CK3, and SC_CK4, the first, second, third, and fourth inverted scan clock signals SC_CKB1, SC_CKB2, SC_CKB3, and SC_CKB4, the first, second, third, and fourth carry clock signals CR_CK1, CR_CK2, CR_CK3, and CR_CK4, and the first, second, third, and fourth inverted carry clock signals CR_CKB1, CR_CKB2, CR_CKB3, and CR_CKB4 may have a high period corresponding to about four horizontal times (4H) and may be shifted by about one horizontal time (1H). Thus, two adjacent clock signals (e.g., a first clock signal SC_CK1 and a second clock signal SC_CK2) may overlap each other by about three horizontal times (3H). Here, the one horizontal time (1H) may be a time allocated to a scan line or a row of pixels, and may approximately correspond to a time calculated by dividing a time of the active period AP by the number of scan lines or the number of pixel rows.

Further, in the active period AP, a portion (e.g., 122, 124, 126, 128, . . . ) of the first to (4L+4)-th active stages 122 to 158 may output the scan signals SC[1], SC[2], SC[3], SC[4], . . . in response to the first, second, third, and fourth scan clock signals SC_CK1, SC_CK2, SC_CK3, and SC_CK4, and another or remaining portion (e.g., 132, 134, 136, 138, . . . , 152, 154, 156, and 158) of the first to (4L+4)-th active stages 122 to 158 may output the scan signals SC[5], SC[6], SC[7], SC[8], . . . , SC[4L+1], SC[4L+2], SC[4L+3], and SC[4L+4] in response to the first, second, third, and fourth inverted scan clock signals SC_CKB1, SC_CKB2, SC_CKB3, and SC_CKB4. Further, the first, fifth, . . . , and (4L+1)-th active stages 122, 132, . . . , and 152 may output the scan signals SC[1], SC[5], . . . , and SC[4L+1] in response to the first scan clock signal SC_CK1 and the first inverted scan clock signal SC_CKB1, the second, sixth, . . . , and (4L+2)-th active stages 124, 134, . . . , and 154 may output the scan signals SC[2], SC[6], . . . , and SC[4L+2] in response to the second scan clock signal SC_CK2 and the second inverted scan clock signal SC_CKB2, the third, seventh, . . . , and (4L+3)-th active stages 126, 136, . . . , and 156 may output the scan signals SC[3], SC[7], . . . , and SC[4L+3] in response to the third scan clock signal SC_CK3 and the third inverted scan clock signal SC_CKB3, and the fourth, eighth, . . . , and (4L+4)-th active stages 128, 138, . . . , and 158 may output the scan signals SC[4], SC[8], . . . , and SC[4L+4] in response to the fourth scan clock signal SC_CK4 and the fourth inverted scan clock signal SC_CKB4. Thus, the first to (4L+4)-th active stages 122 to 158 may sequentially output the first to (4L+4)-th scan signals SC[1] to SC[4L+4] that have a high period corresponding to about four horizontal times (4H) and are shifted by a horizontal time (1H).

Further, in the active period AP, a portion (e.g., 122, 124, 126, 128, . . . ) of the first to (4L+4)-th active stages 122 to 158 may output the carry signals CR[1], CR[2], CR[3], CR[4], . . . in response to the first, second, third, and fourth carry clock signals CR_CK1, CR_CK2, CR_CK3, and CR_CK4, and another or remaining portion (e.g., 132, 134, 136, 138, . . . , 152, 154, 156, and 158) of the first to (4L+4)-th active stages 122 to 158 may output the carry signals CR[5], CR[6], CR[7], CR[8], . . . , CR[4L+1], CR[4L+2], CR[4L+3], and CR[4L+4] in response to the first, second, third, and fourth inverted carry clock signals CR_CKB1, CR_CKB2, CR_CKB3, and CR_CKB4. Further, the first, fifth, . . . , and (4L+1)-th active stages 122, 132, . . . , and 152 may output the carry signals CR[1], CR[5], . . . , and CR[4L+1] in response to the first carry clock signal CR_CK1 and the first inverted carry clock signal CR_CKB1, the second, sixth, . . . , and (4L+2)-th active stages 124, 134, . . . , and 154 may output the carry signals CR[2], CR[6], . . . , and CR[4L+2] in response to the second carry clock signal CR_CK2 and the second inverted carry clock signal CR_CKB2, the third, seventh, . . . , and (4L+3)-th active stages 126, 136, . . . , and 156 may output the carry signals CR[3], CR[7], . . . , and CR[4L+3] in response to the third carry clock signal CR_CK3 and the third inverted carry clock signal CR_CKB3, and the fourth, eighth, . . . , and (4L+4)-th active stages 128, 138, . . . , and 158 may output the carry signals CR[4], CR[8], . . . , and CR[4L+4] in response to the fourth carry clock signal CR_CK4 and the fourth inverted carry clock signal CR_CKB4. Thus, the first to (4L+4)-th active stages 122 to 158 may sequentially output the first to (4L+4)-th carry signals CR[1] to CR[4L+4] that have a high period corresponding to about four horizontal times (4H) and are shifted by a horizontal time (1H).

In some embodiments, as illustrated in FIG. 2, the first, second, third, and fourth carry clock signals CR_CK1, CR_CK2, CR_CK3, and CR_CK4 may lag the first, second, third, and fourth scan clock signals SC_CK1, SC_CK2, SC_CK3, and SC_CK4 by a delay time DT, respectively, and the first, second, third, and fourth inverted carry clock signals CR_CKB1, CR_CKB2, CR_CKB3, and CR_CKB4 may lag the first, second, third, and fourth inverted scan clock signals SC_CKB1, SC_CKB2, SC_CKB3, and SC_CKB4 by the delay time DT, respectively. For example, the delay time DT may be, but is not limited to, about 0.5 μs. Since a falling edge of each carry clock signal (e.g., a first carry clock signal CR_CK1) lags a falling edge of a corresponding scan clock signal (e.g., a first scan clock signal SC_CK1) by the delay time DT, the scan signal (e.g., a first scan signal SC[1]) output by each active stage (e.g., a first active stage 122) may sharply fall.

In some embodiments, the first to (4L+4)-th active stages 122 to 158 may further receive the first control signal CS1 and the second control signal CS2 and may output a scan signal for a sensing operation of a row of pixels in the blank period BP based on the first control signal CS1 and the second control signal CS2.

For example as illustrated in FIG. 3, the first control signal CS1 may have a first pulse at a start time point of the frame period FP. The first to (4L+4)-th active stages 122 to 158 may initialize voltages of select nodes of the first to (4L+4)-th active stages 122 to 158 to a low level based on the first pulse of the first control signal CS1. Further, the first control signal CS1 may have a second pulse while the carry signal (e.g., a first carry signal CR[1]) for a row of pixels on which the sensing operation is to be performed is output. Active stages (e.g., first to fourth active stages 122, 124, 126, and 128) that output the carry signals (e.g., first to fourth carry signals CR[1], CR[2], CR[3], and CR[4]) while the first control signal CS1 has the second pulse, may change the voltages of the select nodes to a high level in response to the second pulse of the first control signal CS1. The second control signal CS2 may have a pulse at a start time point of the blank period BP. The active stages (e.g., first to fourth active stages 122, 124, 126 and 128) including the select nodes having the high-level voltages may output the scan signal (e.g., a first scan signal SC[1]) for the sensing operation in response to the pulse of the second signal CS2 and a corresponding scan clock signal (e.g., a first scan clock signal SC_CK1). In the example illustrated in FIG. 3, since only the first scan clock signal SC_CK1 among the first, second, third, and fourth scan clock signals SC_CK1, SC_CK2, SC_CK3, and SC_CK4 and the first, second, third, and fourth inverted carry clock signals CR_CKB1, CR_CKB2, CR_CKB3, and CR_CKB4 has a pulse, only the first active stage 122 among the active stages (e.g., first to fourth active stages 122, 124, 126 and 128) including the select nodes having the high-level voltages may output the first scan signal SC[1] for the sensing operation. Thus, the sensing operation for a first row of pixels receiving the first scan signal SC[1] may be performed in the blank period BP.

Further, in some embodiments, when a display device including the scan driver 100 is powered off, a sensing operation for all rows of pixels may be performed. In this case, (immediately) before the display device is powered off, the scan driver 100 may sequentially output the first to (4L+4)-th scan signals SC[1] to SC[4L+4] to perform the sensing operation.

For example, as illustrated in FIG. 4, the display device may have a sensing period SENP in which the sensing operation is performed before an off period OFFP in which the display device is powered off. The frame start signal STV may be provided at a start time point of the sensing period SENP, and the first to (4L+4)-th active stages 122 to 158 may reset or discharge control nodes of the first to (4L+4)-th active stages 122 to 158 based on the frame start signal STV. In the sensing period SENP, the first, second, third, and fourth scan clock signals SC_CK1, SC_CK2, SC_CK3, and SC_CK4 and the first, second, third, and fourth inverted scan clock signals SC_CKB1, SC_CKB2, SC_CKB3, and SC_CKB4 may not overlap each other and may have, but are not limited to, a high period of about 30 ms. Thus, the first to (4L+4)-th active stages 122 to 158 may sequentially output the first to (4L+4)-th scan signals SC[1] to SC[4L+4] that do not overlap each other and have a high period of about 30 ms. Accordingly, in the sensing period SENP, the sensing operation for all the rows of pixels may be sequentially performed on a row-by-row basis based on the sequentially output first to (4L+4)-th scan signals SC[1] to SC[4L+4]. Further, in the sensing period SENP, the first, second, third, and fourth carry clock signals CR_CK1, CR_CK2, CR_CK3, and CR_CK4 and the first, second, third, and fourth inverted carry clock signals CR_CKB1, CR_CKB2, CR_CKB3, and CR_CKB4 may have a high period corresponding to about four horizontal times, and the first to (4L+4)-th active stages 122 to 158 may sequentially output the first to (4L+4)-th carry signals CR[1] to CR[4L+4] having a high period corresponding to about four horizontal times. Further, the first control signal CS1 may have a pulse at a start time point of the sensing period SENP, and the second control signal CS2 may have a pulse at an end time point of the sensing period SENP.

Figure 5:
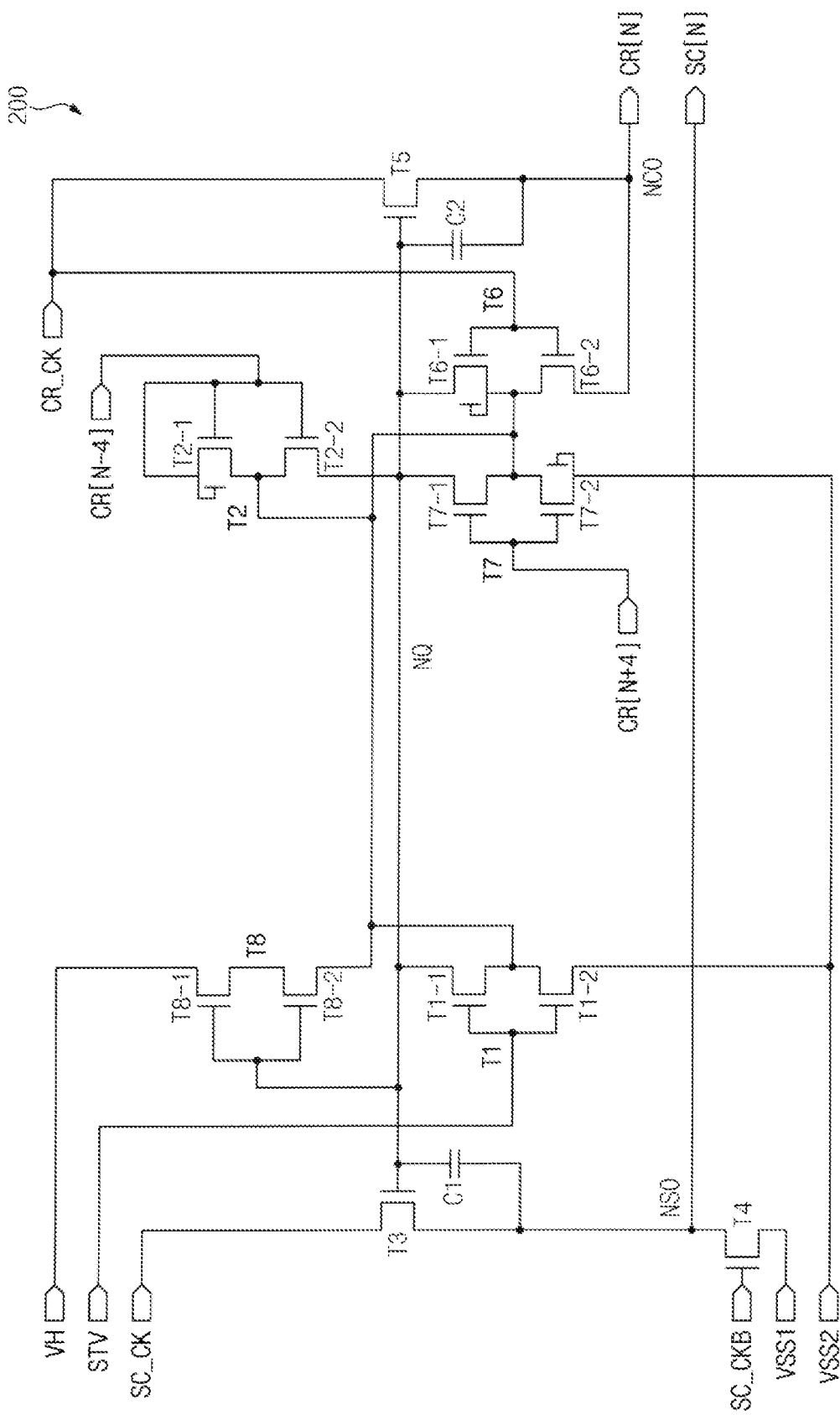
FIG. 5 is a schematic circuit diagram illustrating an active stage of a scan driver according to embodiments.
Figure 6:
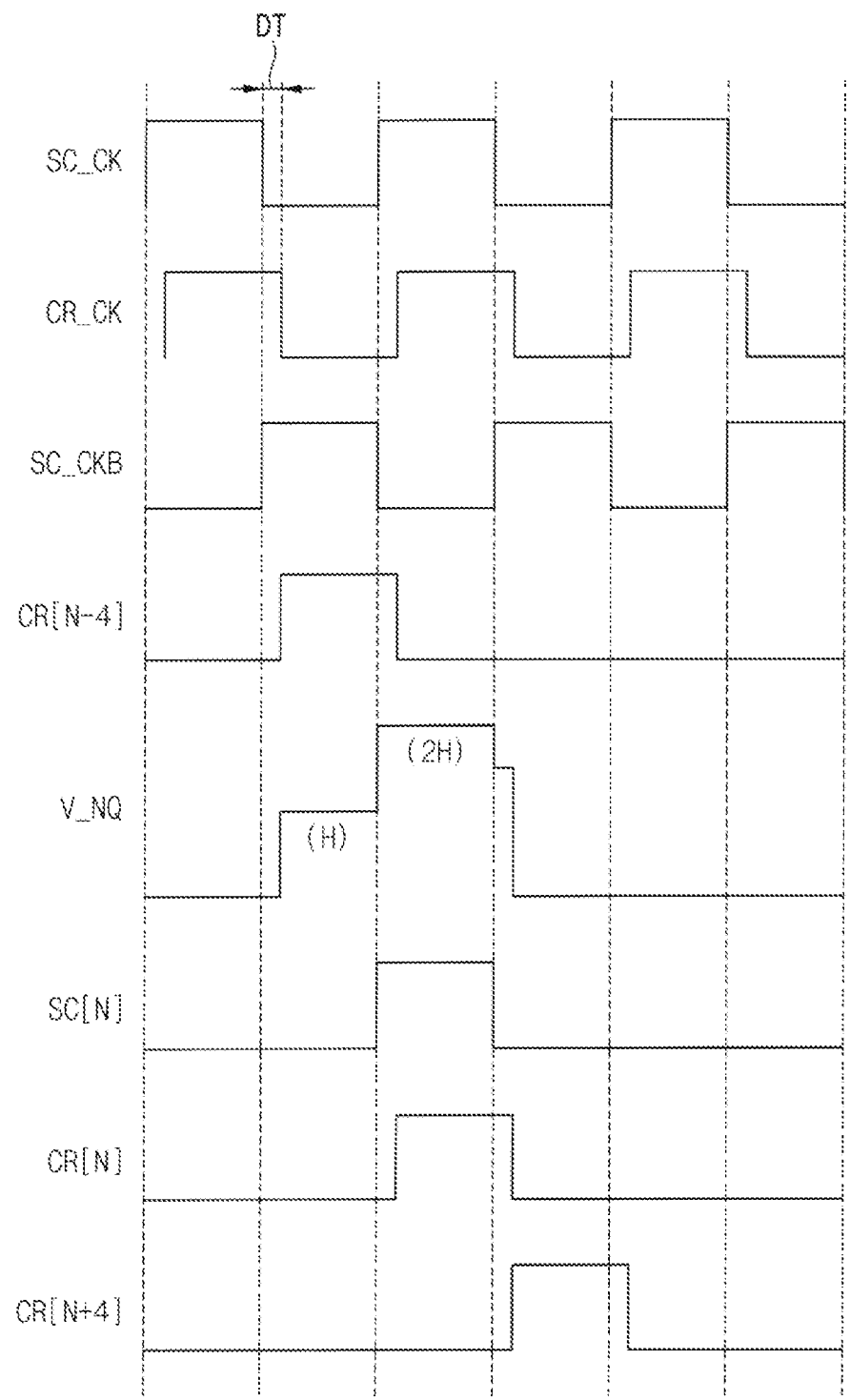
FIG. 6 is a schematic timing diagram for describing an example of an operation of an active stage of FIG. 5.

FIG. 5 is a schematic circuit diagram illustrating an active stage of a scan driver according to embodiments, and FIG. 6 is a schematic timing diagram for describing an example of an operation of the active stage of FIG. 5.

Referring to FIG. 5, an active stage 200 may include a first transistor T1, a second transistor T2, a third transistor T3, a fourth transistor T4, a fifth transistor T5, a sixth transistor T6, a seventh transistor T7, and a first capacitor C1. In some embodiments, the active stage 200 may further include a second capacitor C2 and/or an eighth transistor T8.

The active stage 200 may be one of first to (4L+4)-th active stages 122 to 158 illustrated in FIG. 1, or an N-th active stage, where N is an integer between 1 and 4L+4. For example, in case that the active stage 200 is a first active stage 122 illustrated in FIG. 1, the active stage 200 may receive a first scan clock signal SC_CK1, a first inverted scan clock signal SC_CKB1, and a first carry clock signal CR_CK1 illustrated in FIG. 1 as a scan clock signal SC_CK, an inverted scan clock signal SC_CKB, and a carry clock signal CR_CK illustrated in FIG. 5, respectively. In an embodiment, in case that the active stage 200 is a (4L+4)-th active stage 158 illustrated in FIG. 1, the active stage 200 may receive a fourth inverted scan clock signal SC_CKB4, a fourth scan clock signal SC_CK4, and a fourth inverted carry clock signal CR_CKB4 illustrated in FIG. 1 as the scan clock signal SC_CK, the inverted scan clock signal SC_CKB, and the carry clock signal CR_CK illustrated in FIG. 5, respectively.

The first transistor T1 may reset or discharge a control node NQ in response to a frame start signal STV. The first transistor T1 may be turned on in response to the frame start signal STV, and the turned-on first transistor T1 may transfer a second low voltage VSS2 to the control node NQ. In some embodiments, the first transistor T1 may include a gate receiving the frame start signal STV, a first terminal electrically connected to the control node NQ, and a second terminal receiving the second low voltage VSS2.

In some embodiments, the first transistor T1 may be implemented as a dual transistor including a first sub-transistor T1-1 and a second sub-transistor T1-2 that are electrically connected in series. Thus, a leakage current between the control node NQ and a line of the second low voltage VSS2 may be reduced.

The second transistor T2 may transfer a previous carry signal CR[N−4] to the control node NQ. The second transistor T2 may be diode-connected, and the diode-connected second transistor T2 may charge the control node NQ based on the previous carry signal CR[N−4] having a high level. In some embodiments, the second transistor T2 may include a gate receiving the previous carry signal CR[N−4], a first terminal electrically connected to the gate of the second transistor T2, and a second terminal electrically connected to the control node NQ.

In some embodiments, the second transistor T2 may be implemented as a dual transistor including a first sub-transistor T2-1 and a second sub-transistor T2-2 that are electrically connected in series. Thus, a leakage current between the control node NQ and a line of the previous carry signal CR[N−4] may be reduced. In some embodiments, at least one of the first and second sub-transistors T2-1 and T2-2 may include a back gate, and a terminal of the at least one of the first and second sub-transistors T2-1 and T2-2 may be electrically connected to the back gate. As illustrated in FIG. 5, the first sub-transistor T2-1 may include a back gate, and a terminal of the first sub-transistor T2-1 may be electrically connected to the back gate. Accordingly, the leakage current between the control node NQ and the line of the previous carry signal CR[N−4] may be further reduced.

The third transistor T3 may transfer the scan clock signal SC_CK to a scan output node NSO in response to the voltage of the control node NQ. While the control node NQ is in a charged state, the third transistor T3 may output a scan signal SC[N] having a high level at the scan output node NSO based on the scan clock signal SC_CK having a high level. In some embodiments, the third transistor T3 may include a gate electrically connected to the control node NQ, a first terminal receiving the scan clock signal SC_CK, and a second terminal electrically connected to the scan output node NSO.

The first capacitor C1 may be electrically connected between the control node NQ and the scan output node NSO. In case that the scan clock signal SC_CK having the high level is transferred through the third transistor T3 to the scan output node NSO after the voltage of the control node NQ is charged to a first high level, the voltage of the control node NQ may be boosted from the first high level to a second high level by the first capacitor C1. This operation may be referred to as a bootstrap operation, and the first capacitor C1 may be referred to as a bootstrap capacitor. In some embodiments, the first capacitor C1 may include a first electrode electrically connected to the control node NQ, and a second electrode electrically connected to the scan output node NSO.

The fourth transistor T4 may transfer a first low voltage VSS1 to the scan output node NSO in response to the inverted scan clock signal SC_CKB. The fourth transistor T4 may transfer the first low voltage VSS1 to the scan output node NSO in response to the inverted scan clock signal SC_CKB having a high level, thereby stabilizing the scan signal SC[N] at a low level. In some embodiments, the fourth transistor T4 may include a gate receiving the inverted scan clock signal SC_CKB, a first terminal electrically connected to the scan output node NSO, and a second terminal receiving the first low voltage VSS1.

In some embodiments, a voltage level of the second low voltage VSS2 may be lower than a voltage level of the first low voltage VSS1. For example, the second low voltage VSS2 may be about −10V, and the first low voltage VSS1 may be about −6V. In this case, the control node NQ in a discharged state may have the second low voltage VSS2, the scan output node NSO at which the scan signal SC[N] having a low level is output may have the first low voltage VSS1, the second low voltage VSS2 of the discharged control node NQ may be lower than the first low voltage VSS1 of the scan output node NSO by about 4V, and thus, a gate-source voltage of about −4V may be applied to the third transistor T3 while the scan signal SC[N] having the low level is output. Thus, even if the scan clock signal SC_CK has a high level, a leakage current through the third transistor T3 may be prevented or reduced.

The fifth transistor T5 may transfer the carry clock signal CR_CK to a carry output node NCO in response to the voltage of the control node NQ. While the control node NQ is in a charged state, the fifth transistor T5 may output a carry signal CR[N] having a high level at the carry output node NCO in response to the carry clock signal CR_CK having a high level. In some embodiments, the fifth transistor T5 may include a gate electrically connected to the control node NQ, a first terminal receiving the carry clock signal CR_CK, and a second terminal electrically connected to the carry output node NCO.

The second capacitor C2 may be electrically connected between the control node NQ and the carry output node NCO. Similar to the first capacitor C1, the second capacitor C2 also may perform a bootstrap operation and may be referred to as a bootstrap capacitor. In some embodiments, the second capacitor C2 may include a first electrode electrically connected to the control node NQ, and a second electrode electrically connected to the carry output node NCO.

In some embodiments, the carry clock signal CR_CK may lag the scan clock signal SC_CK by a delay time. For example, the delay time may be, but is not limited to, about 0.5 μs. Since a falling edge of the carry clock signal CR_CK lags a falling edge of the scan clock signal SC_CK or a rising edge of the inverted scan clock signal SC_CKB by the delay time, the second capacitor C2 may prevent the voltage of the control node NQ from being discharged at the falling edge of the scan clock signal SC_CK or the rising edge of the inverted scan clock signal SC_CKB. Accordingly, the active stage 200 may allow the scan signal SC[N] to sharply fall at the falling edge of the scan clock signal SC_CK or the rising edge of the inverted scan clock signal SC_CKB.

The sixth transistor T6 may electrically connect the control node NQ to the carry output node NCO in response to the carry clock signal CR_CK. While the carry signal CR[N] has a low level, the sixth transistor T6 may electrically connect the control node NQ (for example, the gate of the fifth transistor T5) and the carry output node NCO (for example, the second terminal or a source of the fifth transistor T5) in response to the carry clock signal CR_CK having a high level. Thus, the fifth transistor T5 may serve as a diode having the second terminal of the fifth transistor T5 as an anode and the first terminal of the fifth transistor T5 as a cathode, and the diode may allow a current to flow only in a direction from the carry output node NCO to a line of the carry clock signal CR_CK. Accordingly, while the carry signal CR[N] has a low level, a leakage current of the fifth transistor T5 from the line of the carry clock signal CR_CK to the carry output node NCO may be prevented or reduced even if the carry clock signal CR_CK has a high level. In some embodiments, the sixth transistor T6 may include a gate receiving the carry clock signal CR_CK, a first terminal electrically connected to the control node NQ, and a second terminal electrically connected to the carry output node NCO.

In some embodiments, the sixth transistor T6 may be implemented as a dual transistor including a first sub-transistor T6-1 and a second sub-transistor T6-2 that are electrically connected in series. Thus, a leakage current between the control node NQ and the carry output node NCO may be reduced. In some embodiments, a high voltage VH may be applied through the eighth transistor T8 to a node between the first and second sub-transistors T6-1 and T6-2. In some embodiments, a voltage level of the high voltage VH may be higher than a high level of the carry clock signal CR_CK. For example, the high voltage VH may be, but is not limited to, about 28V, and the high level of the carry clock signal CR_CK may be, but is not limited to, about 22V. In this case, while the carry signal CR[N] having the high level is output, since the high voltage VH of about 28V is applied to the node between the first and second sub-transistors T6-1 and T6-2, and the carry clock signal CR_CK of about 22V is applied to a gate of the second sub-transistor T6-2, the second sub-transistor T6-2 may not be turned on, and the control node NQ and the carry output node NCO may not be electrically connected to each other. Thus, while the carry signal CR[N] having the high level is output, the sixth transistor T6 may not affect the fifth transistor T5. Further, in some embodiments, as illustrated in FIG. 5, the first sub-transistor T6-1 may include a back gate, and a terminal of the first sub-transistor T6-1 may be electrically connected to the back gate. Accordingly, the leakage current between the control node NQ and the carry output node NCO may be further reduced.

The seventh transistor T7 may transfer the second low voltage VSS2 to the control node NQ in response to a next carry signal CR[N+4]. The seventh transistor T7 may be turned on in response to the next carry signal CR[N+4], and the turned-on seventh transistor T7 may reset or discharge the control node NQ by transferring the second low voltage VSS2 to the control node NQ. In some embodiments, the seventh transistor T7 may include a gate receiving the next carry signal CR[N+4], a first terminal electrically connected to the control node NQ, and a second terminal receiving the second low voltage VSS2.

In some embodiments, the seventh transistor T7 may be implemented as a dual transistor including a first sub-transistor T7-1 and a second sub-transistor T7-2 that are electrically connected in series. Thus, a leakage current between the control node NQ and a line of the second low voltage VSS2 may be reduced. Further, in some embodiments, as illustrated in FIG. 5, the second sub-transistor T7-2 may include a back gate, and a terminal of the second sub-transistor T7-2 may be electrically connected to the back gate. Accordingly, the leakage current between the control node NQ and the line of the second low voltage VSS2 may be further reduced.

The eighth transistor T8 may transfer the high voltage VH to the node(s) between the first sub-transistors T1-1, T2-1, T6-1, and T7-1 and the second sub-transistors T1-2, T2-2, T6-2, and T7-2 of the first, second, sixth, and seventh transistors T1, T2, T6, and T7, respectively, in response to the voltage of the control node NQ. Thus, even if the voltage of the control node NQ is boosted to the second high level, since the high voltage VH having a voltage level between the low level and the second high level is applied to each node between the first sub-transistors T1-1, T2-1, T6-1, and T7-1 and the second sub-transistors T1-2, T2-2, T6-2, and T7-2, and a drain-source voltage (or a drain-source voltage stress) applied to each of the first, second, sixth, and seventh transistors T1, T2, T6 and T7 may be appropriately distributed to the first sub-transistors T1-1, T2-1, T6-1, and T7-1 and the second sub-transistors T1-2, T2-2, T6-2, and T7-2. Accordingly, the drain-source voltage stress applied to each of the first, second, sixth, and seventh transistors T1, T2, T6 and T7 may be relieved or relaxed. In some embodiments, the eighth transistor T8 may include a gate electrically connected to the control node NQ, a first terminal receiving the high voltage VH, and a second terminal electrically connected to the node(s) between the first sub-transistors T1-1, T2-1, T6-1, and T7-1 and the second sub-transistors T1-2, T2-2, T6-2, and T7-2.

In some embodiments, the eighth transistor T8 may be implemented as a dual transistor including a first sub-transistor T8-1 and a second sub-transistor T8-2 that are electrically connected in series. Thus, a leakage current between the control node NQ and a line of the high voltage VH may be reduced.

In some embodiments, the first to eighth transistors T1 to T8 may be n-type metal-oxide-semiconductor (NMOS) transistors, and a scan driver 100 of FIG. 1 including the active stage 200 may be an oxide silicon gate (OSG) driver including the NMOS transistors. Each stage of a conventional OSG driver may include a number of transistors (e.g., 28 to 31 transistors), and the conventional OSG driver may have a relatively large size. Thus, the conventional OSG driver cannot be integrated or formed within a display region of a display panel in which pixels is formed, the conventional OSG driver may be formed in a peripheral region (for example, a dead space) adjacent to the display region, and thus the dead space may have a relatively large size. However, the active stage 200 of the scan driver 100 according to embodiments may include eight transistors T1 to T8, and thus a size of the scan driver 100 may be reduced compared with the size of the conventional OSG driver. Further, since the active stage 200 includes the reduced number of transistors T1 to T8, the scan driver 100 or active stages 122 to 158 of the scan driver 100 may be formed within a display region of a display panel in which pixels are formed. Accordingly, a dead space of a display device including the scan driver 100 may be reduced compared with the dead space of a conventional display device including the conventional OSG driver.

Hereinafter, an example of an operation of the active stage 200 will be described below with reference to FIGS. 5 and 6.

As illustrated in FIGS. 5 and 6, the active stage 200 may receive the scan clock signal SC_CK, the inverted scan clock signal SC_CKB, and the carry clock signal CR_CK that periodically toggle. In some embodiments, the scan clock signal SC_CK, the inverted scan clock signal SC_CKB, and the carry clock signal CR_CK may have, but is not limited to, a duty ratio of about 50%. In other embodiments, each clock signal may have a duty ratio of about 25%, a duty ratio of about 12.5%, or the like. Further, the scan clock signal SC_CK, the inverted scan clock signal SC_CKB, and the carry clock signal CR_CK may have, but are not limited to, a high period corresponding to about four horizontal times. Further, the inverted scan clock signal SC_CKB may have a phase opposed to a phase of the scan clock signal SC_CK, and the carry clock signal CR_CK may lag the scan clock signal SC_CK by a delay time DT.

In case that the previous carry signal CR[N−4] having a high level is applied, the second transistor T2 may charge control node NQ based on the previous carry signal CR[N−4] having the high level such that the voltage V_NQ of the control node NQ may have a first high level H. If the scan clock signal SC_CK having a high level is applied, the third transistor T3 may output the scan clock signal SC_CK having the high level as the scan signal SC[N] at the scan output node NSO, and the voltage V_NQ of the control node NQ may be boosted from the first high level H to a second high level 2H by the first capacitor C1. Further, if the carry clock signal CR_CK having a high level is applied, the fifth transistor T5 may output the carry clock signal CR_CK having the high level as the carry signal CR[N] at the carry output node NCO. If the scan clock signal SC_CK having a low level and the inverted scan clock signal SC_CKB having a high level are applied, the third transistor T3 may output the scan clock signal SC_CK having the low level as the scan signal SC[N] having a low level at the scan output node NSO, and the fourth transistor T4 may output the first low voltage VSS1 as the scan signal SC[N] having the low level at the scan output node NSO. In some embodiments, the low level of the scan clock signal SC_CK and the first low voltage VSS1 may have substantially the same voltage level. For example, the same voltage level may be, but not limited to, about −6V. Since the falling edge of the carry clock signal CR_CK lags the falling edge of the scan clock signal SC_CK or the rising edge of the inverted scan clock signal SC_CKB by the delay time DT, the scan signal SC[N] may sharply fall at the falling edge of the scan clock signal SC_CK or the rising edge of the inverted scan clock signal SC_CKB. If the next carry signal CR[N+4] having a high level is applied, the seventh transistor T7 may reset or discharge the control node NQ by transferring the second low voltage VSS2 to the control node NQ in response to the next carry signal CR[N+4] having the high level such that the voltage V_NQ of the control node NQ has a low level. After the scan signal SC[N] having the high level is output, the fourth transistor T4 may transfer the first low voltage VSS1 to the scan output node NSO each time the inverted scan clock signal SC_CKB has the high level. The voltage V_NQ of the control node NQ, or the second low voltage VSS2 may be lower than a voltage of the scan output node NSO, or the first low voltage VSS1, and thus a leakage current through the third transistor T3 from a line of the scan clock signal SC_CK to the scan output node NSO may be prevented or reduced. Further, after the carry signal CR[N] having the high level is output, the sixth transistor T6 may electrically connect the control node NQ and the carry output node NCO each time the carry clock signal CR_CK may have the high level. Thus, the fifth transistor T5 may serve or function as a diode having a current path in a direction from the carry output node NCO to the line of the carry clock signal CR_CK, and a leakage current through the fifth transistor T5 from the line of the carry clock signal CR_CK to the carry output node NCO may be prevented or reduced.

Figure 7:
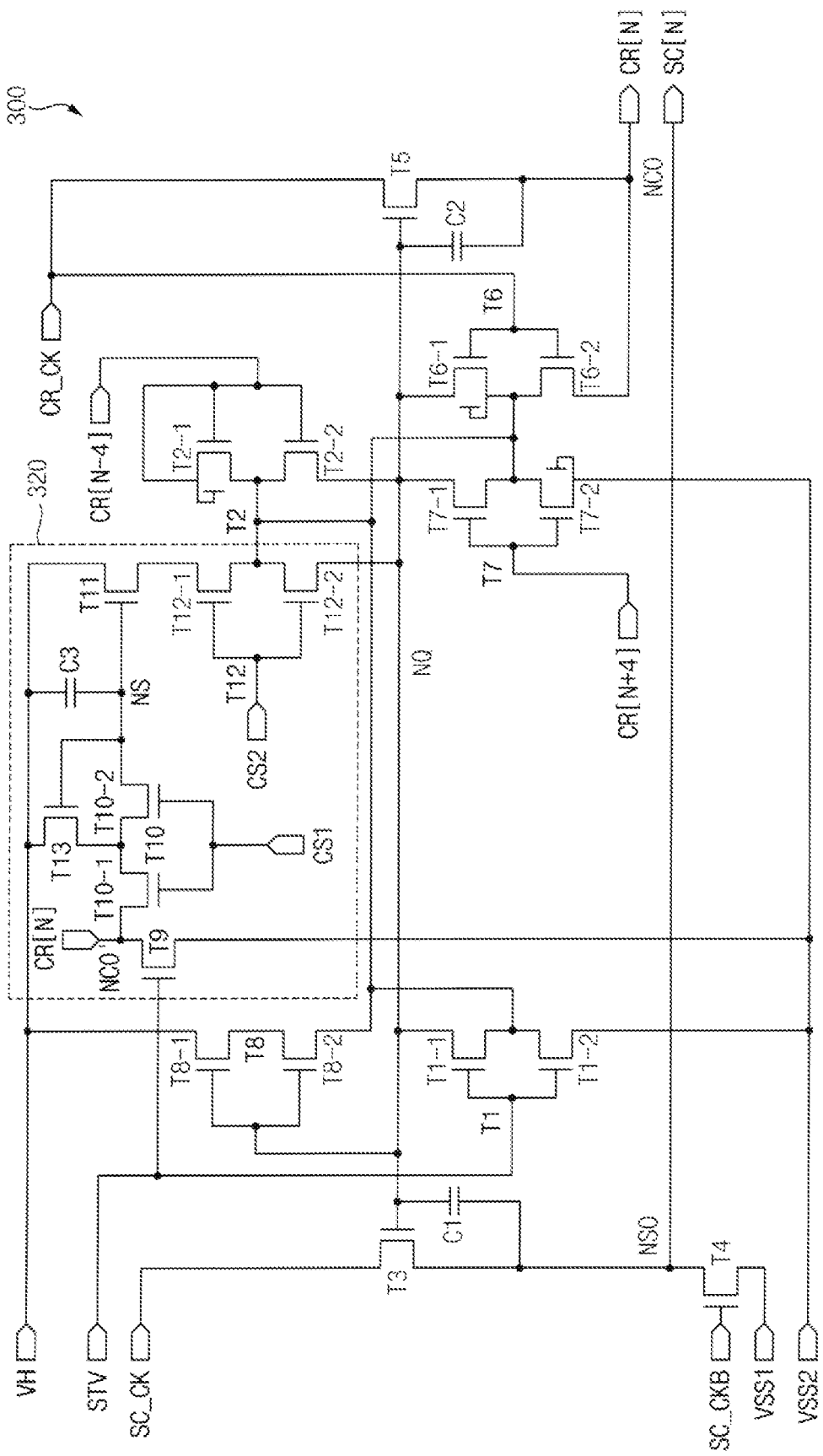
FIG. 7 is a schematic circuit diagram illustrating an active stage of a scan driver according to embodiments.

FIG. 7 is a schematic circuit diagram illustrating an active stage of a scan driver according to embodiments.

Referring to FIG. 7, an active stage 300 may include a first transistor T1, a second transistor T2, a third transistor T3, a fourth transistor T4, a fifth transistor T5, a sixth transistor T6, a seventh transistor T7, an eighth transistor T8, a first capacitor C1, a second capacitor C2, and a sample and hold circuit 320. The active stage 300 of FIG. 7 may have a similar configuration and a similar operation to an active stage 200 of FIG. 5, except that the active stage 300 may further include the sample and hold circuit 320.

The sample and hold circuit 320 may change a voltage of a select node NS to a high level in response to a first control signal CS1 applied while a carry signal CR[N] is output at a carry output node NCO and NCO', and may transfer the voltage of the select node NS to a control node NQ in response to a second control signal CS2 applied in a blank period. In some embodiments, as illustrated in FIG. 7, the sample and hold circuit 320 may include a ninth transistor T9, a tenth transistor T10, a third capacitor C3, an eleventh transistor T11, a twelfth transistor T12, and a thirteenth transistor T13.

The ninth transistor T9 may transfer a second low voltage VSS2 to the carry output node NCO and NCO' in response to a frame start signal STV. Although FIG. 7 illustrates the carry output node NCO' electrically connected to the ninth transistor T9 and the carry output node NCO electrically connected to the fifth and sixth transistors T5 and T6 as being separated from each other, the carry output node NCO' electrically connected to the ninth transistor T9 and the carry output node NCO electrically connected to the fifth and sixth transistors T5 and T6 may be the same carry output node NCO and NCO'. In some embodiments, the ninth transistor T9 may include a gate receiving the frame start signal STV, a first terminal electrically connected to the carry output node NCO and NCO', and a second terminal receiving the second low voltage VSS2.

The tenth transistor T10 may electrically connect the carry output node NCO and NCO' to the select node NS in response to the first control signal CS1. The third capacitor C3 may be electrically connected between a line of a high voltage VH and the select node NS. The first control signal CS1 may have a first pulse at a start time point of a frame period, and the frame start signal STV and the first pulse of the first control signal CS1 may be applied to the active stage 300 for substantially the same time. Thus, the second low voltage VSS2 may be applied to the select node NS through the ninth and tenth transistors T9 and T10, and the third capacitor C3 may maintain the voltage of the select node NS as the second low voltage VSS2. Further, the first control signal CS1 may have a second pulse while the carry signal CR[N] for a row of pixels on which a sensing operation is to be performed in the blank period is output. Thus, in the active stage 300 outputting the carry signal CR[N] having a high level while the first control signal CS1 has the second pulse, the tenth transistor T10 my transfer the carry signal CR[N] having the high level to the select node NS, and the third capacitor C3 may maintain the voltage of the select node NS as the high level. In some embodiments, the tenth transistor T10 may include a gate receiving the first control signal CS1, a first terminal electrically connected to the carry output node NCO and NCO', and a second terminal electrically connected to the select node NS, and the third capacitor C3 may include a first electrode electrically connected to the line of the high voltage VH, and a second electrode electrically connected to the select node NS.

In some embodiments, the tenth transistor T10 may be implemented as a dual transistor including a first sub-transistor T10-1 and a second sub-transistor T10-2 that are electrically connected in series. Thus, a leakage current between the carry output node NCO and NCO' and the select node NS may be reduced.

The eleventh transistor T11 may be turned on in response to the voltage of the select node NS. The twelfth transistor T12 may receive the high voltage VH through the turned-on eleventh transistor T11 and may transfer the received high voltage VH to the control node NQ in response to the second control signal CS2. Further, the second control signal CS2 may have a pulse at a start time point of the blank period. Thus, in the active stage 300 of which the voltage of the select node NS has the high level at the start time point of the blank period, the eleventh and twelfth transistors T11 and T12 may transfer the high voltage VH to the control node NQ, and the active stage 300 may output a scan signal SC[N] having a high level based on a scan clock signal SC_CK having a high level in the blank period. In some embodiments, the eleventh transistor T11 may include a gate electrically connected to the select node NS, a first terminal receiving the high voltage VH, and a second terminal electrically connected to the twelfth transistor T12, and the twelfth transistor T12 may include a gate receiving the second control signal CS2, a first terminal electrically connected to the eleventh transistor T11, and a second terminal electrically connected to the control node NQ.

In some embodiments, the twelfth transistor T12 may be implemented as a dual transistor including a first sub-transistor T12-1 and a second sub-transistor T12-2 that are electrically connected in series. Thus, a leakage current from the control node NQ or to the control node NQ may be reduced. In some embodiments, the high voltage VH may be applied through the eighth transistor T8 to a node between the first and second sub-transistors T12-1 and T12-2.

The thirteenth transistor T13 may transfer the high voltage VH to a node between the first sub-transistor T10-1 and the second sub-transistor T10-2 of the tenth transistor T10 in response to the voltage of the select node NS. Thus, the leakage current between the carry output node NCO and NCO' and the select node NS may be further reduced. In some embodiments, the thirteenth transistor T13 may include a gate electrically connected to the select node NS, a first terminal receiving the high voltage VH, and a second terminal electrically connected to the node between the first sub-transistor T10-1 and the second sub-transistor T10-2 of the tenth transistor T10.

The active stage 300 according to embodiments may include thirteen transistors T1 to T13, and thus a size of a scan driver including the active stage 300 may be reduced compared with a size of a conventional OSG driver. Further, the scan driver including the active stage 300 may be formed within a display region of a display panel in which pixels are formed. Accordingly, a dead space of a display device including the scan driver may be reduced compared with a dead space of a display device including the conventional OSG driver.

Figure 8:
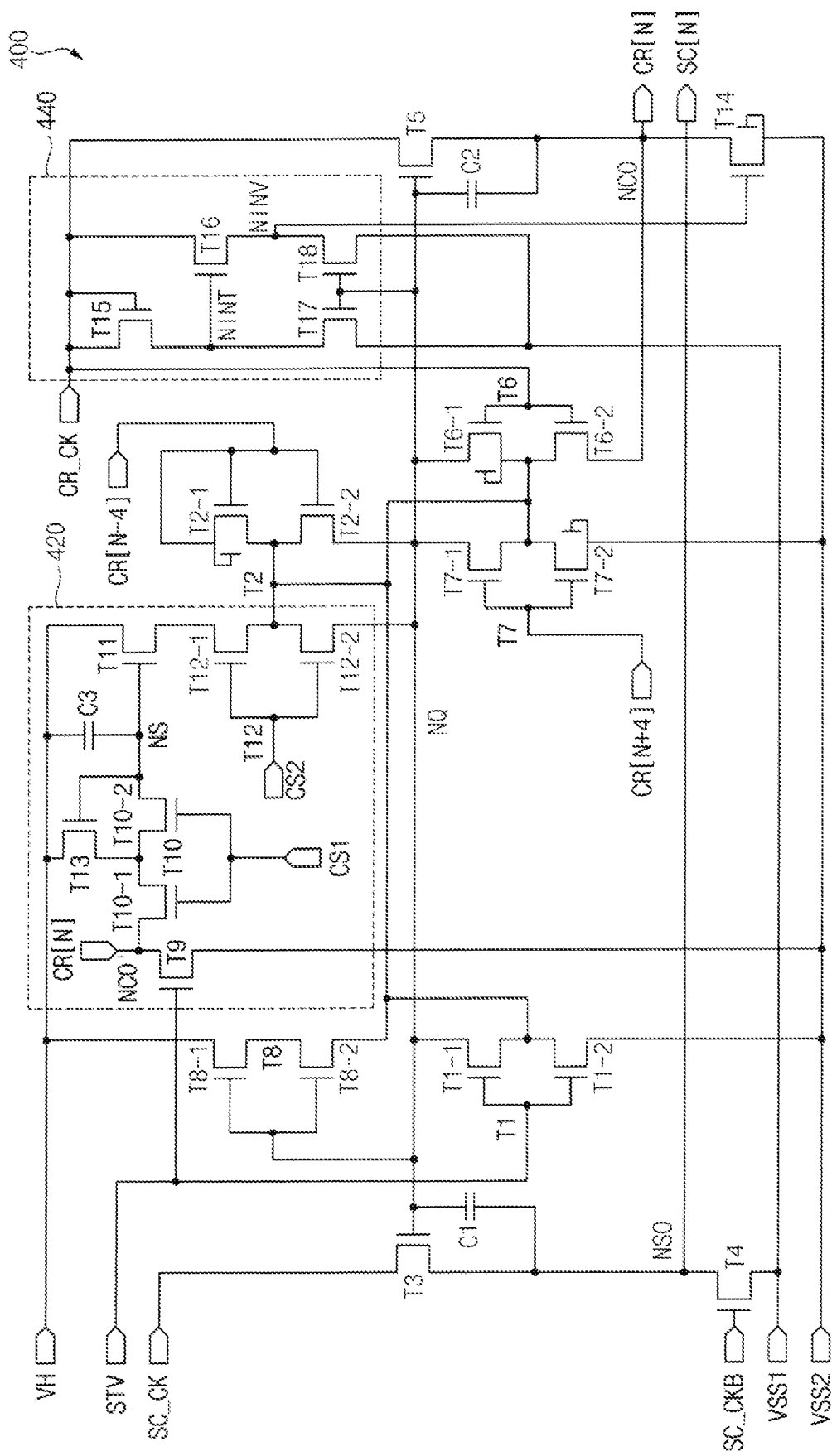
FIG. 8 is a schematic circuit diagram illustrating an active stage of a scan driver according to embodiments.

FIG. 8 is a schematic circuit diagram illustrating an active stage of a scan driver according to embodiments.

Referring to FIG. 8, an active stage 400 may include a first transistor T1, a second transistor T2, a third transistor T3, a fourth transistor T4, a fifth transistor T5, a sixth transistor T6, a seventh transistor T7, an eighth transistor T8, a first capacitor C1, a second capacitor C2, an inverter circuit 440 and a fourteenth transistor T14. In some embodiments, the active stage 400 may further include a sample and hold circuit 420. The active stage 400 of FIG. 8 may have a similar configuration and a similar operation to an active stage 200 of FIG. 5 or an active stage 300 of FIG. 7, except that the active stage 400 may further include the inverter circuit 440 and the fourteenth transistor T14.

The inverter circuit 440 may output a voltage of an inverter node NINV having a high level while a carry clock signal CR_CK has a high level, and a voltage of a control node NQ has a low level. In some embodiments, as illustrated in FIG. 8, the inverter circuit 440 may include a fifteenth transistor T15, a sixteenth transistor T16, a seventeenth transistor T17, and an eighteenth transistor T18.

The fifteenth transistor T15 may transfer the carry clock signal CR_CK to an internal node NINT in response to the carry clock signal CR_CK, the sixteenth transistor T16 may transfer the carry clock signal CR_CK to the inverter node NINV in response to a voltage of the internal node NINT, the seventeenth transistor T17 may transfer a first low voltage VSS1 to the internal node NINT in response to the voltage of the control node NQ, and the eighteenth transistor T18 may transfer the first low voltage VSS1 to the inverter node NINV in response to the voltage of the control node NQ. The inverter circuit 440 including the fifteenth, sixteenth, seventeenth, and eighteenth transistors T15, T16, T17, and T18 may output the voltage of the inverter node NINV having a low level while the voltage of the control node NQ has a high level, and may output the voltage of the inverter node NINV having a high level while the voltage of the control node NQ has a low level and the carry clock signal CR_CK has a high level. In some embodiments, the fifteenth transistor T15 may include a gate receiving the carry clock signal CR_CK, a first terminal electrically connected to the gate of the fifteenth transistor T15, and a second terminal electrically connected to the internal node NINT, the sixteenth transistor T16 may include a gate electrically connected to the internal node NINT, a first terminal receiving the carry clock signal CR_CK, and a second terminal electrically connected to the inverter node NINV, the seventeenth transistor T17 may include a gate electrically connected to the control node NQ, a first terminal electrically connected to the internal node NINT, and a second terminal receiving the first low voltage VSS1, and the eighteenth transistor T18 may include a gate electrically connected to the control node NQ, a first terminal electrically connected to the inverter node NINV, and a second terminal receiving the first low voltage VSS1.

The fourteenth transistor T14 may transfer a second low voltage VSS2 to a carry output node NCO in response to the voltage of the inverter node NINV. The fourteenth transistor T14 may transfer the second low voltage VSS2 to the carry output node NCO in response to the voltage of the inverter node NINV having the high level, thereby stabilizing the carry output node NCO and a carry signal CR[N] at a low level. In some embodiments, the fourteenth transistor T14 may include a gate electrically connected to the inverter node NINV, a first terminal electrically connected to the carry output node NCO, and a second terminal receiving the second low voltage VSS2. Further, in some embodiments, as illustrated in FIG. 8, the fourteenth transistor T14 may include a back gate, the second terminal of the fourteenth transistor T14 may be electrically connected to the back gate. Accordingly, a leakage current between the carry output node NCO and a line of the second low voltage VSS2 may be reduced.

The active stage 400 according to embodiments may include eighteen transistors T1 to T18, and thus a size of a scan driver including the active stage 400 may be reduced compared with a size of a conventional OSG driver. Further, the scan driver including the active stage 400 may be formed within a display region of a display panel in which pixels are formed. Accordingly, a dead space of a display device including the scan driver may be reduced compared with a dead space of a display device including the conventional OSG driver.

Figure 9:
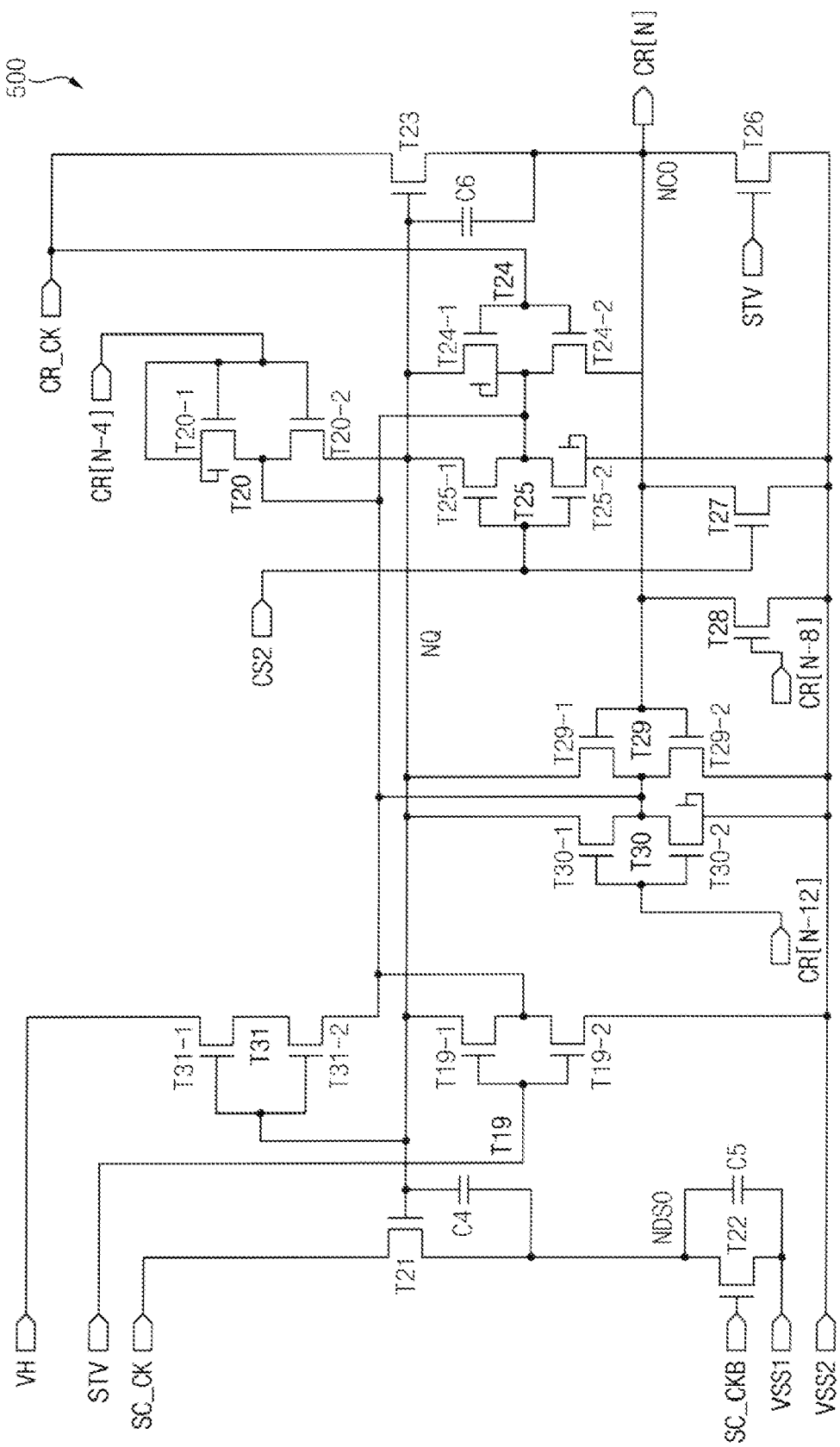
FIG. 9 is a schematic circuit diagram illustrating a subsequent dummy stage of a scan driver according to embodiments.

FIG. 9 is a schematic circuit diagram illustrating a subsequent dummy stage of a scan driver according to embodiments.

Referring to FIG. 9, a subsequent dummy stage 500 may include a nineteenth transistor T19, a twentieth transistor T20, a twenty-first transistor T21, a twenty-second transistor T22, a twenty-third transistor T23, a twenty-fourth transistor T24, a twenty-fifth transistor T25, a twenty-sixth transistor T26, a twenty-seventh transistor T27, a twenty-eighth transistor T28, a twenty-ninth transistor T29, a thirtieth transistor T30, a fourth capacitor C4, a fifth capacitor C5 and a sixth capacitor C6. In some embodiments, the subsequent dummy stage 500 may further include a thirty-first transistor T31. The subsequent dummy stage 500 may be any of first, second, third, and fourth subsequent dummy stages 162, 164, 166, and 168 illustrated in FIG. 1.

The nineteenth transistor T19, the twentieth transistor T20, the twenty-first transistor T21, the twenty-second transistor T22, the twenty-third transistor T23, the twenty-fourth transistor T24, the twenty-fifth transistor T25, the twenty-sixth transistor T26, the thirty-first transistor T31, the fourth capacitor C4, and the sixth capacitor C6 may correspond to a first transistor T1, a second transistor T2, a third transistor T3, a fourth transistor T4, a fifth transistor T5, a sixth transistor T6, a seventh transistor T7, a ninth transistor T9, an eighth transistor T8, a first capacitor C1 and a second capacitor C2 illustrated in FIG. 7, respectively. However, unlike the seventh transistor T7 receiving a next carry signal CR[N+4], the twenty-fifth transistor T25 may receive a second control signal CS2.

The nineteenth transistor T19 may reset a control node NQ in response to a frame start signal STV, the twentieth transistor T20 may transfer a first previous carry signal CR[N−4] to the control node NQ, the twenty-first transistor T21 may transfer a scan clock signal SC_CK to a dummy scan output node NDSO in response to a voltage of the control node NQ, the fourth capacitor C4 may be electrically connected between the control node NQ and the dummy scan output node NDSO, the twenty-second transistor T22 may transfer a first low voltage VSS1 to the dummy scan output node NDSO in response to an inverted scan clock signal SC_CKB, and the fifth capacitor C5 may be electrically connected between the dummy scan output node NDSO and a line of the first low voltage VSS1. The subsequent dummy stage 500 may output no scan signal and may not be electrically connected to a scan line. Thus, to perform an operation similar to an operation of an active stage electrically connected to a scan line, the subsequent dummy stage 500 may include the fifth capacitor C5 corresponding to a load of the scan line. In some embodiments, the fifth capacitor C5 may include a first electrode electrically connected to the dummy scan output node NDSO, and a second electrode electrically connected to the line of the first low voltage VSS1.

The twenty-third transistor T23 may transfer a carry clock signal CR_CK to a carry output node NCO in response to the voltage of the control node NQ, the sixth capacitor C6 may be electrically connected between the control node NQ and the carry output node NCO, the twenty-fourth transistor T24 may electrically connect the control node NQ to the carry output node NCO in response to the carry clock signal CR_CK, the twenty-fifth transistor T25 may transfer a second low voltage VSS2 to the control node NQ in response to the second control signal CS2, and the twenty-sixth transistor T26 may transfer the second low voltage VSS2 to the carry output node NCO in response to the frame start signal STV.

The thirty-first transistor T31 may transfer a high voltage VH to a node between first sub-transistors T19-1, T20-1, T24-1, T25-1, T29-1, and T30-1 and second sub-transistors T19-2, T20-2, T24-2, T25-2, T29-2, and T30-2 of the nineteenth, twentieth, twenty-fourth, twenty-fifth, twenty-ninth, and thirtieth transistors T19, T20, T24, T25, T29, and T30, respectively, in response to the voltage of the control node NQ. Further, in some embodiments, the thirty-first transistor T31 may be implemented as a dual transistor including a first sub-transistor T31-1 and a second sub-transistor T31-2 that are electrically connected in series.

The twenty-seventh transistor T27 may transfer the second low voltage VSS2 to the carry output node NCO in response to the second control signal CS2, and the twenty-eighth transistor T28 may transfer the second low voltage VSS2 to the carry output node NCO in response to a second previous carry signal CR[N−8]. In some embodiments, the twenty-seventh transistor T27 may include a gate receiving the second control signal CS2, a first terminal electrically connected to the carry output node NCO, and a second terminal receiving the second low voltage VSS2, and the twenty-eighth transistor T28 may include a gate receiving the second previous carry signal CR[N−8], a first terminal electrically connected to the carry output node NCO, and a second terminal receiving the second low voltage VSS2.

The twenty-ninth transistor T29 may transfer the second low voltage VSS2 to the control node NQ in response to a voltage of the carry output node NCO. In some embodiments, while the carry signal CR[N] having a high level is output at the carry output node NCO, the twenty-ninth transistor T29 may allow the voltage of control node NQ to gradually decrease. Further, in some embodiments, the twenty-ninth transistor T29 may include a gate electrically connected to the carry output node NCO, a first terminal electrically connected to the control node NQ, and a second terminal receiving the second low voltage VSS2. In some embodiments, the twenty-ninth transistor T29 may be implemented as a dual transistor including a first sub-transistor T29-1 and a second sub-transistor T29-2 that are electrically connected in series. Thus, a leakage current between the control node NQ and a line of the second low voltage VSS2 may be reduced. Further, a node between the first sub-transistor T29-1 and the second sub-transistor T29-2 may receive the high voltage VH through the thirty-first transistor T31.

The thirtieth transistor T30 may transfer the second low voltage VSS2 to the control node NQ in response to a third previous carry signal CR[N−12]. In some embodiments, the thirtieth transistor T30 may include a gate receiving the third previous carry signal CR[N−12], a first terminal electrically connected to the control node NQ, and a second terminal receiving the second low voltage VSS2. In some embodiments, the thirtieth transistor T30 may be implemented as a dual transistor including a first sub-transistor T30-1 and a second sub-transistor T30-2 that are electrically connected in series. Thus, a leakage current between the control node NQ and the line of the second low voltage VSS2 may be reduced. Further, a node between the first sub-transistor T30-1 and the second sub-transistor T30-2 may receive the high voltage VH through the thirty-first transistor T31. Further, in some embodiments, the second sub-transistor T30-2 may include a back gate, and a terminal of the second sub-transistor T30-2 may be electrically connected to the back gate. Accordingly, the leakage current between the control node NQ and the line of the second low voltage VSS2 may be further reduced.

Figure 10:
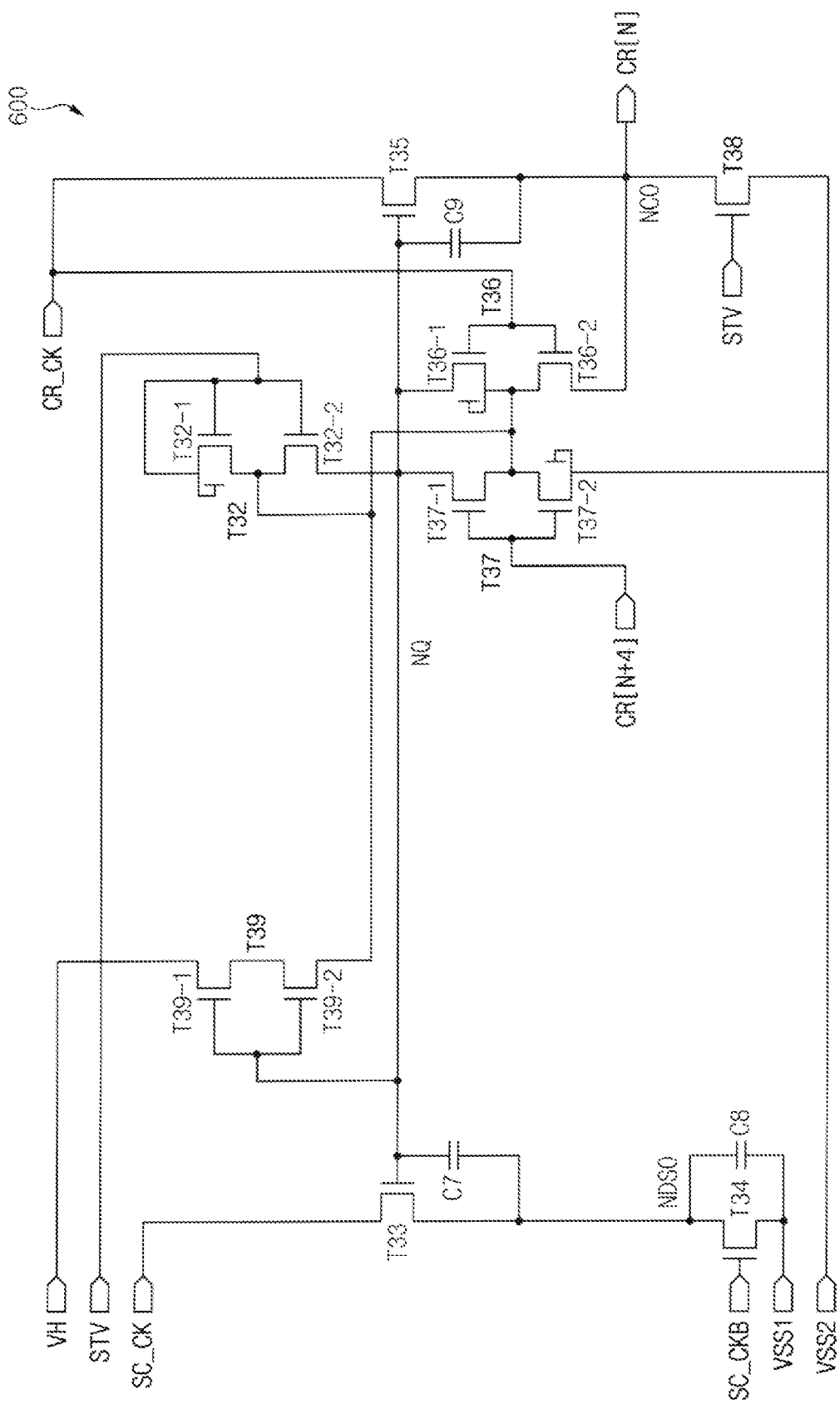
FIG. 10 is a schematic circuit diagram illustrating a previous dummy stage of a scan driver according to embodiments.

FIG. 10 is a schematic circuit diagram illustrating a previous dummy stage of a scan driver according to embodiments.

Referring to FIG. 10, a previous dummy stage 600 may include a thirty-second transistor T32, a thirty-third transistor T33, a thirty-fourth transistor T34, a thirty-fifth transistor T35, a thirty-sixth transistor T36, a thirty-seventh transistor T37, a thirty-eighth transistor T38, a seventh capacitor C7, an eighth capacitor C8 and a ninth capacitor C9. In some embodiments, the previous dummy stage 600 may further include a thirty-ninth transistor T39. The previous dummy stage 600 may be any of first, second, third, and fourth previous dummy stages 112, 114, 116, and 118 illustrated in FIG. 1.

The thirty-second transistor T32, the thirty-third transistor T33, the thirty-fourth transistor T34, the thirty-fifth transistor T35, the thirty-sixth transistor T36, the thirty-seventh transistor T37, the thirty-eighth transistor T38, the thirty-ninth transistor T39, the seventh capacitor C7, and the ninth capacitor C9 may correspond to a second transistor T2, a third transistor T3, a fourth transistor T4, a fifth transistor T5, a sixth transistor T6, a seventh transistor T7, a ninth transistor T9, an eighth transistor T8, a first capacitor C1 and a second capacitor C2 illustrated in FIG. 7, respectively. However, unlike the second transistor T2 receiving a previous carry signal CR[N−4], the thirty-second transistor T32 may receive a frame start signal STV.

The thirty-second transistor T32 may transfer the frame start signal STV to a control node NQ, the thirty-third transistor T33 may transfer a scan clock signal SC_CK to a dummy scan output node NDSO in response to a voltage of the control node NQ, the seventh capacitor C7 may be electrically connected between the control node NQ and the dummy scan output node NDSO, the thirty-fourth transistor T34 may transfer a first low voltage VSS1 to the dummy scan output node NDSO in response to an inverted scan clock signal SC_CKB, and the eighth capacitor C8 may be electrically connected between the dummy scan output node NDSO and a line of the first low voltage VSS1. The previous dummy stage 600 may not output a scan signal and may not be electrically connected to a scan line. Thus, to perform an operation similar to an operation of an active stage electrically connected to a scan line, the previous dummy stage 600 may include the eighth capacitor C8 corresponding to a load of the scan line. In some embodiments, the eighth capacitor C8 may include a first electrode electrically connected to the dummy scan output node NDSO, and a second electrode electrically connected to the line of the first low voltage VSS1.

The thirty-fifth transistor T35 may transfer a carry clock signal CR_CK to a carry output node NCO in response to the voltage of the control node NQ, the ninth capacitor C9 may be electrically connected between the control node NQ and the carry output node NCO, the thirty-sixth transistor T36 may electrically connect the control node NQ to the carry output node NCO in response to the carry clock signal CR_CK, the thirty-seventh transistor T37 may transfer a second low voltage VSS2 to the control node NQ in response to a next carry signal CR[N+4], and the thirty-eighth transistor T38 may transfer the second low voltage VSS2 to the carry output node NCO in response to the frame start signal STV.

In some embodiments, each of the thirty-second, thirty-sixth, and thirty-seventh transistors T32, T36, and T37 may be implemented as a dual transistor including a first sub-transistor T32-1, T36-1, and T37-1 and a second sub-transistor T32-2, T36-2, and T37-2 that are electrically connected in series. The thirty-ninth transistor T39 may transfer a high voltage VH to a node between the first sub-transistor T32-1, T36-1, and T37-1 and the second sub-transistor T32-2, T36-2, and T37-2 of each of the thirty-second, thirty-sixth, and thirty-seventh transistors T32, T36, and T37 in response to the voltage of the control node NQ. Further, in some embodiments, the thirty-ninth transistor T39 may be implemented as a dual transistor including a first sub-transistor T39-1 and a second sub-transistor T39-2 that are electrically connected in series.

Figure 11:
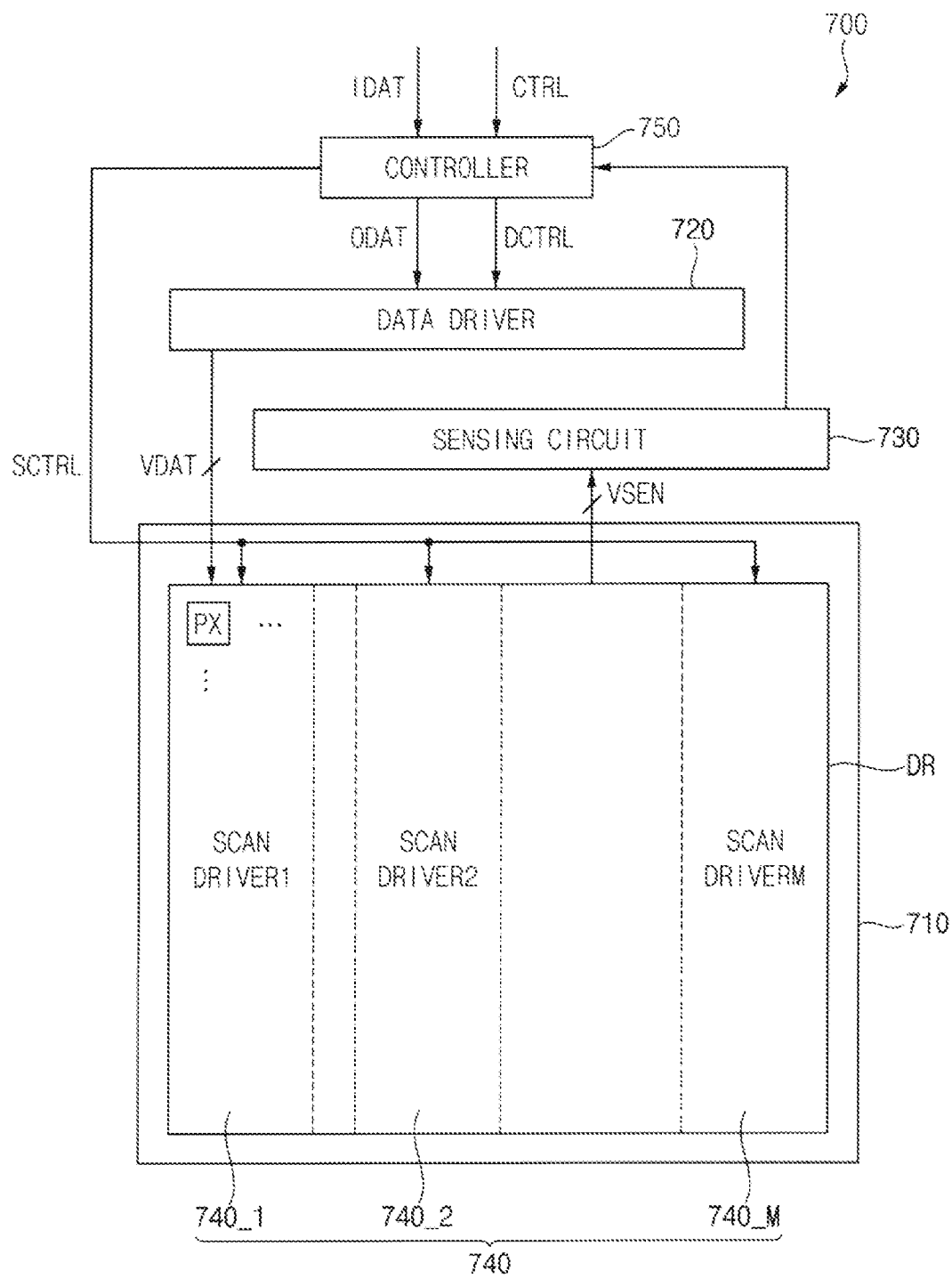
FIG. 11 is a schematic block diagram illustrating a display device according to embodiments.
Figure 12:
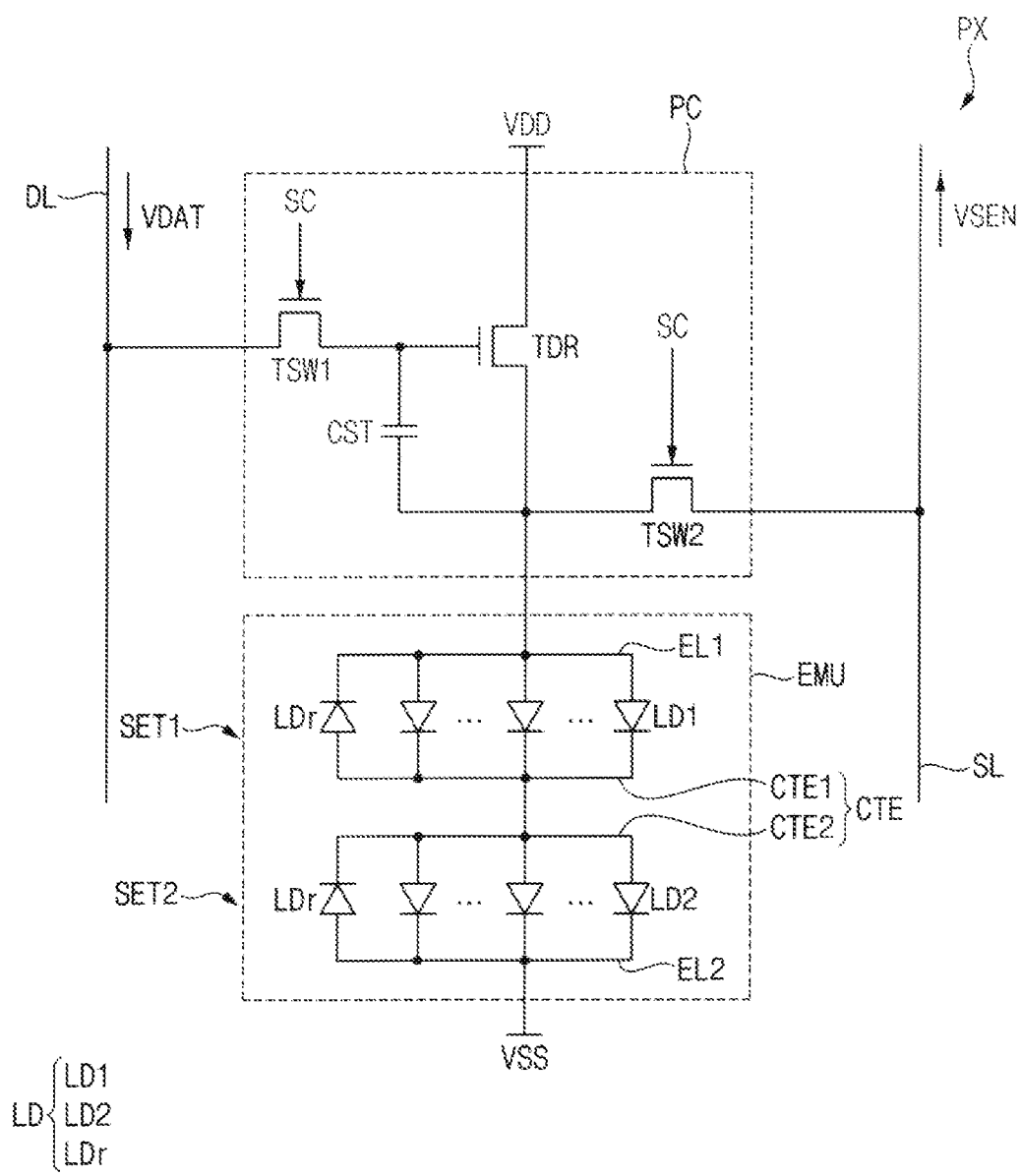
FIG. 12 is a schematic circuit diagram illustrating an example of a pixel included in a display device of FIG. 11.
Figure 13:
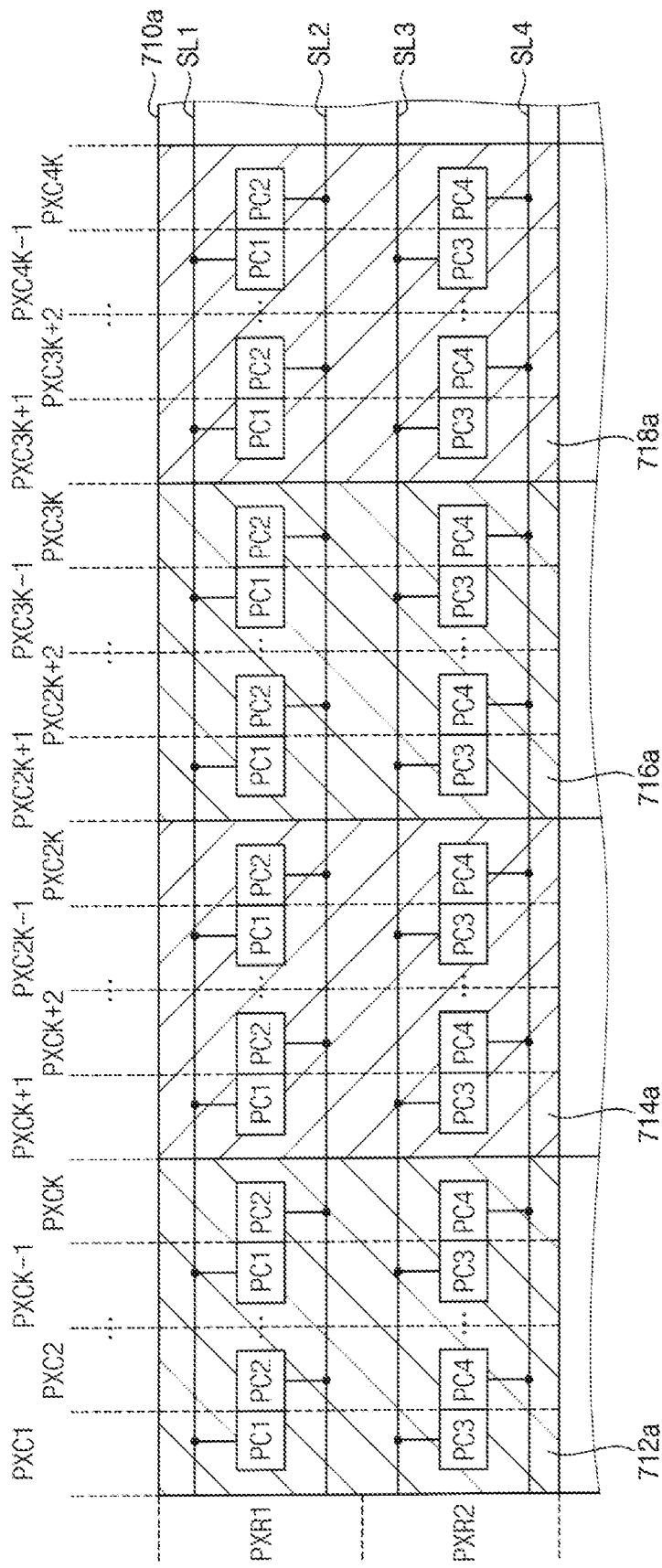
FIG. 13 is a schematic diagram illustrating an example of a portion of a display panel in which first to fourth active stages for first through fourth scan lines are formed.
Figure 14:
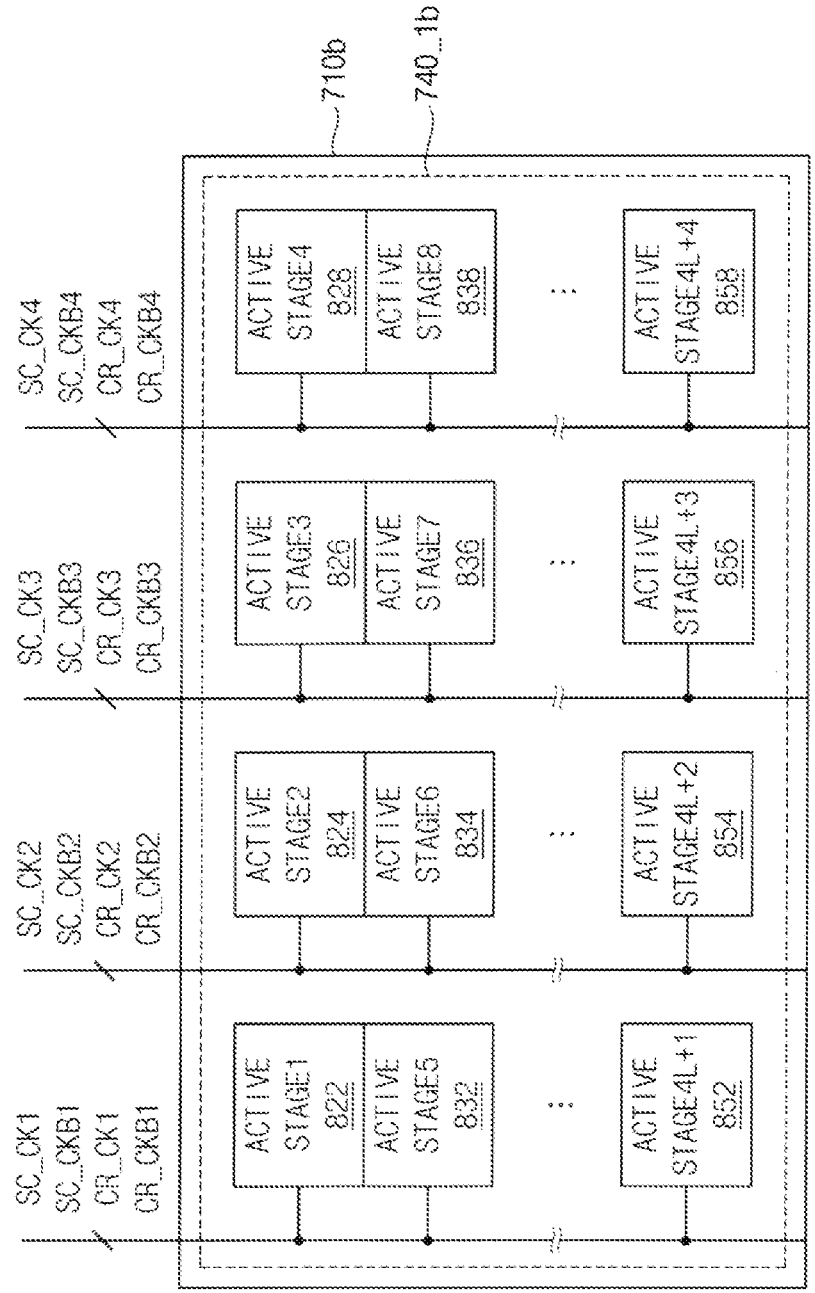
FIG. 14 is a schematic diagram illustrating an example of a portion of a display panel in which a scan driver is formed for describing connection relationships between active stages and clock signal lines.

FIG. 11 is a schematic block diagram illustrating a display device according to embodiments, FIG. 12 is a schematic circuit diagram illustrating an example of a pixel included in a display device of FIG. 11, FIG. 13 is a schematic diagram illustrating an example of a portion of a display panel in which first to fourth active stages for first to fourth scan lines are formed, and FIG. 14 is a schematic diagram illustrating an example of a portion of a display panel in which a scan driver is formed for describing connection relationships between active stages and clock signal lines.

Referring to FIG. 11, a display device 700 according to embodiments may include a display panel 710 including pixels PX, a data driver 720 providing data voltages VDAT to the pixels PX, a sensing circuit 730 receiving sensing voltages VSEN from the pixels PX, at least one scan driver 740 providing scan signals to the pixels PX, and a controller 750 controlling the data driver 720, the sensing circuit 730, and the scan driver 740.

The display panel 710 may have a display region DR and may include the pixels PX formed in the display region DR. For example, as illustrated in FIG. 12, each pixel PX may include a light emitting unit (or light emitting part) EMU and a pixel circuit PC for driving the light emitting unit EMU. In some embodiments, the light emitting unit EMU may include, but is not limited to, light emitting elements LD as illustrated in FIG. 12. For example, the light emitting unit EMU may be an organic light emitting diode (OLED).

The pixel circuit PC may include a driving transistor TDR, a first switching transistor TSW1, a second switching transistor TSW2, and a storage capacitor CST. The storage capacitor CST may include a first electrode electrically connected to a gate of the driving transistor TDR, and a second electrode electrically connected to a source of the driving transistor TDR. The first switching transistor TSW1 may electrically connect a data line DL to the first electrode of the storage capacitor CST in response to a scan signal SC, and the second switching transistor TSW2 may electrically connect a sensing line SL to the second electrode of the storage capacitor CST in response to the scan signal SC. The driving transistor TDR may generate a driving current based on a data voltage VDAT stored in the storage capacitor CST.

The light emitting unit EMU may include a first serial set SET1 and a second serial set SET2 that are electrically connected in series between a line of a first power supply voltage VDD (e.g., a high power supply voltage) and a line of a second power supply voltage VSS (e.g., a low power supply voltage). Each of the first serial set SET1 and the second serial set SET2 may include light emitting elements LD that are electrically connected in parallel with each other. The first and second serial sets SET1 and SET2 may include electrodes (e.g., EL1 and EL2) and intermediate electrodes CTE (e.g., CTE1 and CTE2). For example, the first serial set SET1 may include a first electrode EL1 and a first intermediate electrode CTE1 and may include at least one first light emitting element LD1 electrically connected between the first electrode EL1 and the first intermediate electrode CTE1. Further, the first serial set SET1 may include a reversed light emitting element LDr that is electrically connected in an opposite direction to the first light emitting element LD1 between the first electrode EL1 and the first intermediate electrode CTE1. The second serial set SET2 may include a second intermediate electrode CTE2 and a second electrode EL2 and may include at least one second light emitting element LD2 electrically connected between the second intermediate electrode CTE2 and the second electrode EL2. Further, the second serial set SET2 may include a reversed light emitting element LDr that is electrically connected in an opposite direction to the second light emitting element LD2 between the second intermediate electrode CTE2 and the second electrode EL2. The first electrode EL1 of the first serial set SET1 may be an anode of the light emitting unit EMU of each pixel PX, and the second electrode EL2 of the second serial set SET2 may be a cathode of the light emitting unit EMU. The light emitting unit EMU may emit light based on the driving current generated by the driving transistor TDR.

In some embodiments, to perform a sensing operation for the pixel PX, a reference voltage may be applied to the first electrode of the storage capacitor CST through the data line DL, and the second electrode of the storage capacitor CST may have a voltage obtained by subtracting a threshold voltage of the driving transistor TDR from the reference voltage. A voltage equal to the reference voltage less the threshold voltage may be provided as the sensing voltage VSEN through the second switching transistor TSW2 and the sensing line SL to the sensing circuit 730.

The data driver 720 may provide the data voltages VDAT to the pixels PX based on output image data ODAT and a data control signal DCTRL received from the controller 750. In some embodiments, the data control signal DCTRL may include, but is not limited to, an output data enable signal, a horizontal start signal, and a load signal. In some embodiments, the data driver 720 and the sensing circuit 730 may be implemented with at least one same integrated circuit. The integrated circuit including the data driver 720 and the sensing circuit 730 may be referred to as a readout-source driver integrated circuit (RSIC). In other embodiments, the data driver 720 and the controller 750 may be implemented with a single integrated circuit, and the single integrated circuit may be referred to as a timing controller embedded data driver (TED) integrated circuit. In still other embodiments, the data driver 720, the sensing circuit 730, and the controller 750 may be implemented with separate integrated circuits.

The sensing circuit 730 may perform a sensing operation for the pixels PX. In some embodiments, the sensing circuit 730 may perform a sensing operation for a row of pixels PX in a blank period of each frame period. In some embodiments, the sensing circuit 730 may perform a sensing operation for all pixels PX (immediately) before the display device 700 is powered off.

The scan driver 740 may provide the scan signals to the pixels PX based on a scan control signal SCTRL received from the controller 750. In some embodiments, as illustrated in FIG. 1, the scan control signal SCTRL may include a frame start signal STV, scan clock signals SC_CK1 to SC_CK4, inverted scan clock signals SC_CKB1 to SC_CKB4, carry clock signals CR_CK1 to CR_CK4, and inverted carry clock signals CR_CKB1 to CR_CKB4. Further, in some embodiments, as illustrated in FIG. 1, the scan control signal SCTRL may further include a first control signal CS1 and a second control signal CS2. In some embodiments, the scan driver 740 or active stages of the scan driver 740 may be within the display region DR as illustrated in FIG. 11. For example, the scan driver 740 formed within the display region DR may be referred to as a driver in pixel (DIP). Accordingly, sizes of the display panel 710 and a dead space of the display device 700 may be reduced compared with a conventional display device in which a scan driver is formed in a peripheral region of a display panel. In some embodiments, previous and subsequent dummy stages of the scan driver 740 also may be formed within the display region DR. In other embodiments, the previous and subsequent dummy stages may be formed in a peripheral region adjacent to the display region DR, or in the dead space.

In some embodiments, the display device 700 may include a scan driver 740_1. In other embodiments, the display device 700 may include two scan drivers 740_1 and 740_M. In this case, the two scan drivers 740_1 and 740_M may apply a scan signal at both ends of each scan line, and thus a delay or a distortion of the scan signal may be reduced. In still other embodiments, as illustrated in FIG. 11, the display device 700 may include M scan drivers 740_1, 740_2, . . . , and 740_M, where M is an integer greater than 0. For example, the display device 700 may include eight scan drivers 740_1, 740_2, . . . , and 740_M. In this case, the delay or the distortion of the scan signal may be further reduced.

In some embodiments, transistors and capacitors of each active stage of the scan driver 740 may be dispersedly disposed in a portion of the display region DR in which 2×K pixels PX are formed, where K is an integer greater than 1. For example, the active stage may be distributed in a portion of the display region DR in which 2×34 pixels PX are formed, but the location of the active stage is not limited thereto.

For example, as illustrated in FIG. 13, a display panel 710a may include first pixel circuits PC1 electrically connected to a first scan line SL1, second pixel circuits PC2 electrically connected to a second scan line SL2, third pixel circuits PC3 electrically connected to a third scan line SL3, and fourth pixel circuits PC4 electrically connected to a fourth scan line SL4. The first pixel circuits PC1 may be located in a first pixel row PXR1 and odd-numbered pixel columns PXCL PXCK−1, PXCK+1, PXC2K−1, PXC2K+1, PXC3K−1, PXC3K+1, and PXC4K−1 of pixel columns PXC1 to PXC4K, and the second pixel circuits PC2 may be located in the first pixel row PXR1 and even-numbered pixel columns PXC2, PXCK, PXCK+2, PXC2K, PXC2K+2, PXC3K, PXC3K+2, and PXC4K of the pixel columns PXC1 to PXC4K. In some embodiments, as illustrated in FIG. 13, each first pixel circuit PC1 and a corresponding second pixel circuit PC2 may be located adjacent to each other while having a mirror structure, and thus an area of the display region DR in which the transistors and the capacitors of the active stage are to be disposed may be maximized. Further, the third pixel circuits PC3 may be located in a second pixel row PXR2 and the odd-numbered pixel columns PXCL PXCK−1, PXCK+1, PXC2K−1, PXC2K+1, PXC3K−1, PXC3K+1, and PXC4K−1, and the fourth pixel circuits PC4 may be located in the second pixel row PXR2 and the even-numbered pixel columns PXC2, PXCK, PXCK+2, PXC2K, PXC2K+2, PXC3K, PXC3K+2, and PXC4K. In some embodiments, as illustrated in FIG. 13, each third pixel circuit PC3 and a corresponding fourth pixel circuit PC4 may be located adjacent to each other while having a mirror structure, thereby maximizing an area of the display region DR in which the transistors and the capacitors of the active stage are to be disposed.

A first active stage electrically connected to the first scan line SL1 may be located in the first pixel row PXR1 and first to K-th pixel columns PXC1 to PXCK of the pixel columns PXC1 to PXC4K, where K is an integer greater than 1. Thus, transistors and capacitors of the first active stage may be formed in a portion 712a of the display region DR (except for a region in which the first, second, third, and fourth pixel circuits PC1, PC2, PC3, and PC4 are formed) corresponding to the first pixel row PXR1 and the first to K-th pixel columns PXC1 to PXCK. Further, a second active stage electrically connected to the second scan line SL2 may be located in the first pixel row PXR1 and (K+1)-th to 2K-th pixel columns PXCK+1 to PXC2K of the pixel columns PXC1 to PXC4K. Thus, transistors and capacitors of the second active stage may be formed in a portion 714a of the display region DR (except for a region in which the first, second, third, and fourth pixel circuits PC1, PC2, PC3, and PC4 are formed) corresponding to the first pixel row PXR1 and the (K+1)-th to 2K-th pixel columns PXCK+1 to PXC2K. Further, a third active stage electrically connected to the third scan line SL3 may be located in the second pixel row PXR2 and (2K+1)-th to 3K-th pixel columns PXC2K+1 to PXC3K of the pixel columns PXC1 to PXC4K. Thus, transistors and capacitors of the third active stage may be formed in a portion 716a of the display region DR (except for a region in which the first, second, third, and fourth pixel circuits PC1, PC2, PC3, and PC4 are formed) corresponding to the second pixel row PXR2 and the (2K+1)-th to 3K-th pixel columns PXC2K+1 to PXC3K. Further, a fourth active stage electrically connected to the fourth scan line SL4 may be located in the second pixel row PXR2 and (3K+1)-th to 4K-th pixel columns PXC3K+1 to PXC4K of the pixel columns PXC1 to PXC4K. Thus, transistors and capacitors of the fourth active stage may be formed in a portion 718a of the display region DR (except for a region in which the first, second, third, and fourth pixel circuits PC1, PC2, PC3, and PC4 are formed) corresponding to the second pixel row PXR2 and the (3K+1)-th to 4K-th pixel columns PXC3K+1 to PXC4K.

As illustrated in FIG. 14, (4L+1)-th active stages 822, 832, . . . , and 852 of a scan driver 740_1b of a display panel 710b may receive a first scan clock signal SC_CK1, a first inverted scan clock signal SC_CKB1, a first carry clock signal CR_CK1, and a first inverted carry clock signal CR_CKB1, (4L+2)-th active stages 824, 834, . . . and 854 of the scan driver 740_1b may receive a second scan clock signal SC_CK2, a second inverted scan clock signal SC_CKB2, a second carry clock signal CR_CK2, and a second inverted carry clock signal CR_CKB2, (4L+3)-th active stages 826, 836, . . . and 856 of the scan driver 740_1b may receive a third scan clock signal SC_CK3, a third inverted scan clock signal SC_CKB3, a third carry clock signal CR_CK3, and a third inverted carry clock signal CR_CKB3, and (4L+4)-th active stages 828, 838, . . . , and 858 of the scan driver 740_1b may receive a fourth scan clock signal SC_CK4, a fourth inverted scan clock signal SC_CKB4, a fourth carry clock signal CR_CK4, and a fourth inverted carry clock signal CR_CKB4, where L is an integer greater than or equal to 0. Further, the (4L+1)-th active stages 822, 832, . . . and 852 may be located in the first to K-th pixel columns PXC1 to PXCK, the (4L+2)-th active stages 824, 834, . . . and 854 may be located in the (K+1)-th to 2K-th pixel columns PXCK+1 to PXC2K, the (4L+3)-th active stages 826, 836, . . . and 856 may be located in the (2K+1)-th to 3K-th pixel columns PXC2K+1 to PXC3K, and the (4L+4)-th active stages 828, 838, . . . and 858 may be located in the (3K+1)-th to 4K-th pixel columns PXC3K+1 to PXC4K. Thus, lines of the first, second, third, and fourth scan clock signals SC_CK1, SC_CK2, SC_CK3, and SC_CK4 may be spaced apart from each other, lines of the first, second, third, and fourth inverted scan clock signals SC_CKB1, SC_CKB2, SC_CKB3, and SC_CKB4 may be spaced apart from each other, lines of the first, second, third, and fourth carry clock signals CR_CK1, CR_CK2, CR_CK3, and CR_CK4 may be spaced apart from each other, and lines of the first, second, third, and fourth inverted carry clock signals CR_CKB1, CR_CKB2, CR_CKB3, and CR_CKB4 may be spaced apart from each other. Further, the lines of the first, second, third, and fourth scan clock signals SC_CK1, SC_CK2, SC_CK3, and SC_CK4 may be disposed adjacent to the lines of the first, second, third, and fourth inverted scan clock signals SC_CKB1, SC_CKB2, SC_CKB3, and SC_CKB4, respectively, and thus an influence by each scan clock signal (e.g., SC_CK1) on a pixel circuit PC may be compensated for by a corresponding inverted scan clock signal (e.g., SC_CKB1). Further, the lines of the first, second, third, and fourth carry clock signals CR_CK1, CR_CK2, CR_CK3, and CR_CK4 may be disposed adjacent to the lines of the first, second, third, and fourth inverted carry clock signals CR_CKB1, CR_CKB2, CR_CKB3, and CR_CKB4, respectively, and thus an influence by each carry clock signal (e.g., CR_CK1) on a pixel circuit PC may be compensated for by a corresponding inverted carry clock signal (e.g., CR_CKB1).

The controller 750 (e.g., a timing controller (TCON)) may receive input image data IDAT and a control signal CTRL from an external host processor (e.g., an application processor (AP), a graphics processing unit (GPU), or a graphics card). In some embodiments, the input image data IDAT may be RGB image data including red image data, green image data, and blue image data. In some embodiments, the control signal CTRL may include, but is not limited to, a vertical synchronization signal, a horizontal synchronization signal, an input data enable signal, and a master clock signal. The controller 750 may control an operation of the data driver 720 by providing the output image data ODAT and the data control signal DCTRL to the data driver 720, and may control an operation of the scan driver 740 by providing the scan control signal SCTRL to the scan driver 740.

Figure 15:
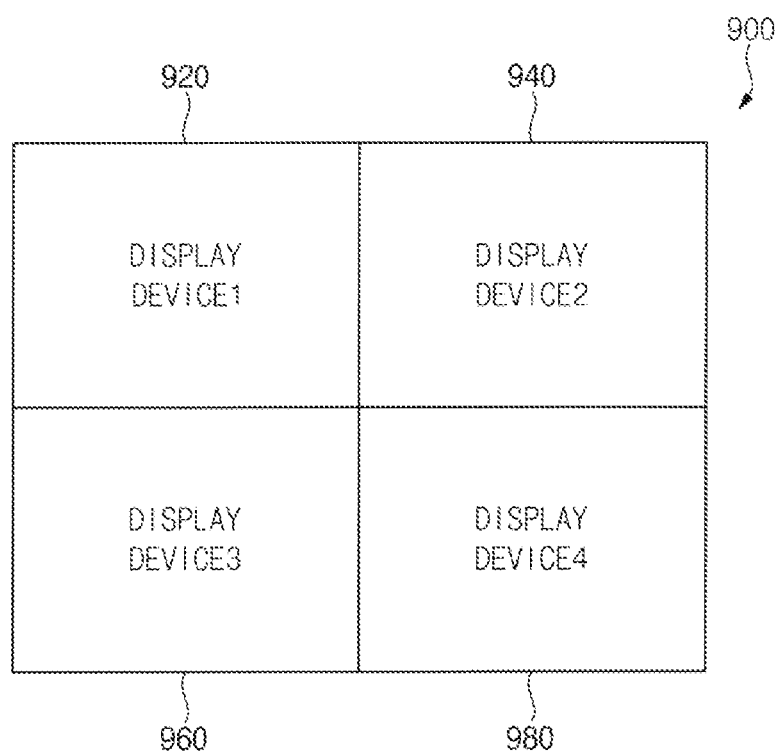
FIG. 15 is a schematic block diagram illustrating a tiled display device including display devices according to embodiments.

FIG. 15 is a schematic block diagram illustrating a tiled display device including display devices according to embodiments.

Referring to FIG. 15, a tiled display device 900 may include display devices 920, 940, 960, and 980 electrically connected to each other. In some embodiments, each display device 920, 940, 960, and 980 may be a display device 700 of FIG. 11. Each display device 920, 940, 960, and 980 may include a scan driver formed within a display region of a display panel, and thus may have a small dead space. Accordingly, each display device 920, 940, 960, and 980 may be suitable for the tiled display device 900.

Figure 16:
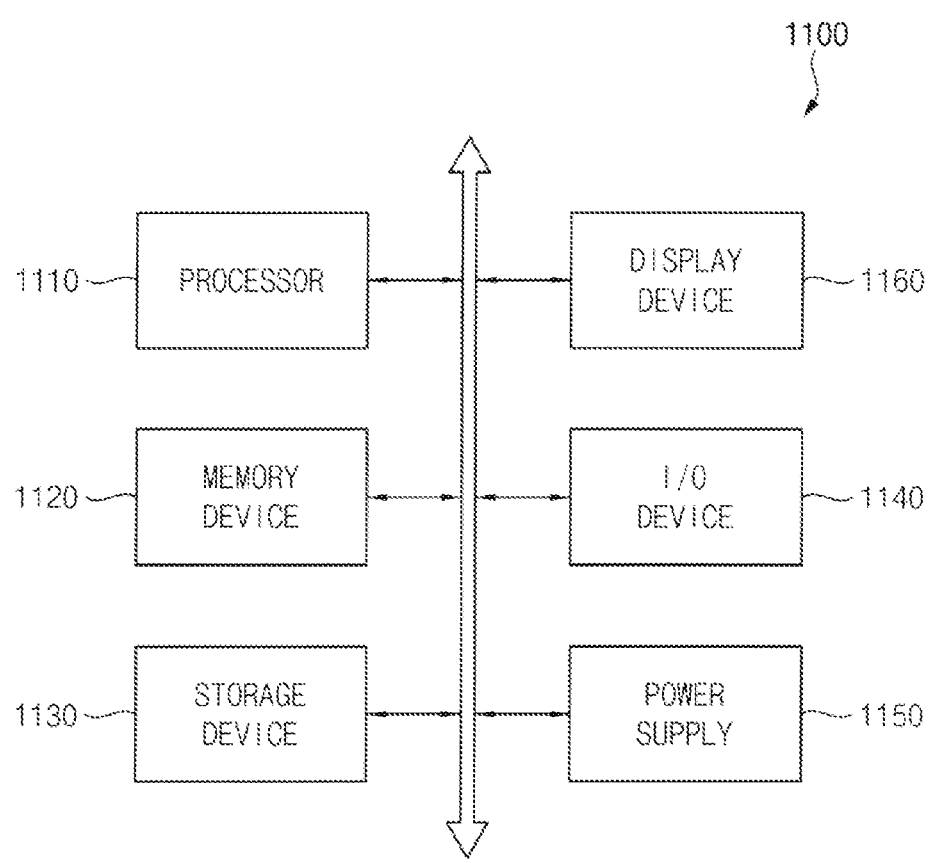
FIG. 16 is a schematic block diagram illustrating an electronic device including a display device according to embodiments.

FIG. 16 is a schematic block diagram illustrating an electronic device including a display device according to embodiments.

Referring to FIG. 16, an electronic device 1100 may include a processor 1110, a memory device 1120, a storage device 1130, an input/output (I/O) device 1140, a power supply 1150, and a display device 1160. The electronic device 1100 may further include ports for communicating with a video card, a sound card, a memory card, a universal serial bus (USB) device, other electric devices, etc.

The processor 1110 may perform various computing functions or tasks. The processor 1110 may be an application processor (AP), a microprocessor, a central processing unit (CPU), etc. The processor 1110 may be electrically connected to other components via an address bus, a control bus, a data bus, etc. In some embodiments, the processor 1110 may be further electrically connected to an extended bus such as a peripheral component interconnect (PCI) bus.

The memory device 1120 may store data for operations of the electronic device 1100. For example, the memory device 1120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile dynamic random access memory (mobile DRAM) device, etc.

The storage device 1130 may be a solid state drive (SSD) device, a hard disk drive (HDD) device, a CD-ROM device, etc. The I/O device 1140 may be an input device such as a keyboard, a keypad, a mouse, a touch screen, etc., and an output device such as a printer, a speaker, etc. The power supply 1150 may supply power for operations of the electronic device 1100. The display device 1160 may be electrically connected to other components through the buses or other communication links.

In the display device 1160, each active stage of a scan driver may have an 8T2C structure illustrated in FIG. 5, a 13T3C structure illustrated in FIG. 7, an 18T3C structure illustrated in FIG. 8, or the like. Accordingly, the number of transistors include in the active stage may be reduced compared with the number of transistors include in a stage of a conventional scan driver, and a size of the scan driver according to embodiments may be reduced compared with a size of a conventional scan driver. Further, since the active stage includes the reduced number of transistors, in some embodiments, the scan driver may be formed within a display region of a display panel. Accordingly, a dead space of the display device 1160 may be reduced compared with a dead space of a conventional display device including the conventional scan driver.

The embodiments may be applied to any display device 1160 and any electronic device 1100 including the display device 1160. For example, the embodiments may be applied to a smart phone, a wearable electronic device, a tablet computer, a mobile phone, a television (TV), a digital TV, a 3D TV, a personal computer (PC), a home appliance, a laptop computer, a personal digital assistant (PDA), a portable multimedia player (PMP), a digital camera, a music player, a portable game console, a navigation device, etc.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the disclosure. Accordingly, all such modifications are intended to be included within the scope of the disclosure. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A scan driver comprising:
   active stages, each of the active stages comprising:
   a first transistor that resets a control node in response to a frame start signal;
   a second transistor that transfers a previous carry signal to the control node;
   a third transistor that transfers a scan clock signal to a scan output node in response to a voltage of the control node;
   a first capacitor electrically connected between the control node and the scan output node;
   a fourth transistor that transfers a first low voltage to the scan output node in response to an inverted scan clock signal;
   a fifth transistor that transfers a carry clock signal to a carry output node in response to the voltage of the control node;
   a sixth transistor that electrically connects the control node to the carry output node in response to the carry clock signal; and
   a seventh transistor that transfers a second low voltage to the control node in response to a next carry signal, wherein
   the carry clock signal lags the scan clock signal by a delay time.

2. The scan driver of claim 1, wherein the active stages are disposed within a display region of a display panel that includes pixels.

3. The scan driver of claim 1, wherein each of the scan clock signal, the inverted scan clock signal, and the carry clock signal has a duty ratio of about 50%.

4. The scan driver of claim 1, wherein
   each of the active stages further comprises a second capacitor electrically connected between the control node and the carry output node.

5. The scan driver of claim 1, wherein a voltage level of the second low voltage is lower than a voltage level of the first low voltage.

6. The scan driver of claim 1, wherein
   the first transistor includes:
      a gate receiving the frame start signal;
      a first terminal electrically connected to the control node; and
      a second terminal receiving the second low voltage,
   the second transistor includes:
      a gate receiving the previous carry signal;
      a first terminal electrically connected to the gate of the second transistor; and
      a second terminal electrically connected to the control node,
   the third transistor includes:
      a gate electrically connected to the control node;
      a first terminal receiving the scan clock signal; and
      a second terminal electrically connected to the scan output node,
   the fourth transistor includes:
      a gate receiving the inverted scan clock signal;
      a first terminal electrically connected to the scan output node; and
      a second terminal receiving the first low voltage,
   the fifth transistor includes:
      a gate electrically connected to the control node;
      a first terminal receiving the carry clock signal; and
      a second terminal electrically connected to the carry output node,
   the sixth transistor includes:
      a gate receiving the carry clock signal;
      a first terminal electrically connected to the control node; and
      a second terminal electrically connected to the carry output node, and
   the seventh transistor includes:
      a gate receiving the next carry signal;
      a first terminal electrically connected to the control node; and
      a second terminal receiving the second low voltage.

7. The scan driver of claim 1, wherein
   each of the first, second, sixth, and seventh transistors is implemented as a dual transistor including a first sub-transistor and a second sub-transistor, and
   each of the active stages further comprises an eighth transistor that transfers a high voltage to a node between the first sub-transistor and the second sub-transistor of each of the first, second, sixth and seventh transistors in response to the voltage of the control node.

8. The scan driver of claim 7, wherein a voltage level of the high voltage is higher than a high level of the carry clock signal.

9. The scan driver of claim 7, wherein
   at least one of the first and second sub-transistors of each of the second, sixth, and seventh transistors includes a back gate, and
   a terminal of the at least one of the first and second sub-transistors is electrically connected to the back gate.

10. The scan driver of claim 1, wherein each of the active stages further comprises a sample and hold circuit that changes a voltage of a select node to a high level in response to a first control signal applied while a carry signal is output at the carry output node, and transfers the voltage of the select node to the control node in response to a second control signal applied in a blank period.

11. The scan driver of claim 10, wherein the sample and hold circuit includes:
   a ninth transistor that transfers the second low voltage to the carry output node in response to the frame start signal;
   a tenth transistor that electrically connects the carry output node to the select node in response to the first control signal, the tenth transistor including a first sub-transistor and a second sub-transistor that are electrically connected in series;
   a third capacitor electrically connected between a line of a high voltage and the select node;
   an eleventh transistor that is turned on in response to the voltage of the select node;
   a twelfth transistor that receives the high voltage through the turned-on eleventh transistor, and transfers the received high voltage to the control node in response to the second control signal; and a thirteenth transistor that transfers the high voltage to a node between the first sub-transistor and the second sub-transistor in response to the voltage of the select node.

12. The scan driver of claim 1, wherein each of the active stages further comprises:
an inverter circuit that outputs a voltage of an inverter node having a high level while the carry clock signal has a high level and the voltage of the control node has a low level; and
a fourteenth transistor that transfers the second low voltage to the carry output node in response to the voltage of the inverter node.

13. The scan driver of claim 12, wherein the inverter circuit includes:
a fifteenth transistor that transfers the carry clock signal to an internal node in response to the carry clock signal;
a sixteenth transistor that transfers the carry clock signal to the inverter node in response to a voltage of the internal node;
a seventeenth transistor that transfers the first low voltage to the internal node in response to the voltage of the control node; and
an eighteenth transistor that transfers the first low voltage to the inverter node in response to the voltage of the control node.

14. The scan driver of claim 1, further comprising:
at least one subsequent dummy stage located subsequent to the active stages,
wherein the subsequent dummy stage includes:
a nineteenth transistor that resets a control node of the subsequent dummy stage in response to the frame start signal;
a twentieth transistor that transfers a first previous carry signal to the control node of the subsequent dummy stage;
a twenty-first transistor that transfers the scan clock signal to a dummy scan output node in response to a voltage of the control node of the subsequent dummy stage;
a fourth capacitor electrically connected between the control node of the subsequent dummy stage and the dummy scan output node;
a twenty-second transistor that transfers the first low voltage to the dummy scan output node in response to the inverted scan clock signal;
a fifth capacitor electrically connected between the dummy scan output node and a line of the first low voltage;
a twenty-third transistor that transfers the carry clock signal to a carry output node of the subsequent dummy stage in response to the voltage of the control node of the subsequent dummy stage;
a sixth capacitor electrically connected between the control node of the subsequent dummy stage and the carry output node of the subsequent dummy stage;
a twenty-fourth transistor that electrically connects the control node of the subsequent dummy stage to the carry output node of the subsequent dummy stage in response to the carry clock signal;
a twenty-fifth transistor that transfers the second low voltage to the control node of the subsequent dummy stage in response to a second control signal;
a twenty-sixth transistor that transfers the second low voltage to the carry output node of the subsequent dummy stage in response to the frame start signal;
a twenty-seventh transistor that transfers the second low voltage to the carry output node of the subsequent dummy stage in response to the second control signal;
a twenty-eighth transistor that transfers the second low voltage to the carry output node of the subsequent dummy stage in response to a second previous carry signal;
a twenty-ninth transistor that transfers the second low voltage to the control node of the subsequent dummy stage in response to a voltage of the carry output node of the subsequent dummy stage; and
a thirtieth transistor that transfers the second low voltage to the control node of the subsequent dummy stage in response to a third previous carry signal.

15. The scan driver of claim 14, wherein
each of the nineteenth, twentieth, twenty-fourth, twenty-fifth, twenty-ninth, and thirtieth transistors is implemented as a dual transistor including a first sub-transistor and a second sub-transistor, and
the subsequent dummy stage further includes a thirty-first transistor that transfers a high voltage to a node between the first sub-transistor and the second sub-transistor of each of the nineteenth, twentieth, twenty-fourth, twenty-fifth, twenty-ninth, and thirtieth transistors in response to the voltage of the control node of the subsequent dummy stage.

16. The scan driver of claim 1, further comprising:
at least one previous dummy stage located previous to the active stages,
wherein the previous dummy stage includes:
a thirty-second transistor that transfers the frame start signal to a control node of the previous dummy stage;
a thirty-third transistor that transfers the scan clock signal to a dummy scan output node in response to a voltage of the control node of the previous dummy stage;
a seventh capacitor electrically connected between the control node of the previous dummy stage and the dummy scan output node;
a thirty-fourth transistor that transfers the first low voltage to the dummy scan output node in response to the inverted scan clock signal;
an eighth capacitor electrically connected between the dummy scan output node and a line of the first low voltage;
a thirty-fifth transistor that transfers the carry clock signal to a carry output node of the previous dummy stage in response to the voltage of the control node of the previous dummy stage;
a ninth capacitor electrically connected between the control node of the previous dummy stage and the carry output node of the previous dummy stage;
a thirty-sixth transistor that electrically connects the control node of the previous dummy stage to the carry output node of the previous dummy stage in response to the carry clock signal;
a thirty-seventh transistor that transfers the second low voltage to the control node of the previous dummy stage in response to a first next carry signal; and
a thirty-eighth transistor that transfers the second low voltage to the carry output node of the previous dummy stage in response to the frame start signal.

17. The scan driver of claim 16, wherein
each of the thirty-second, thirty-sixth, and thirty-seventh transistors is implemented as a dual transistor including a first sub-transistor and a second sub-transistor, and
the previous dummy stage includes a thirty-ninth transistor that transfers a high voltage to a node between the first sub-transistor and the second sub-transistor of each of the thirty-second, thirty-sixth, and thirty-seventh transistors in response to the voltage of the control node of the previous dummy stage.

18. A display device comprising:
a display panel having a display region, and including pixels disposed in the display region;
a scan driver including active stages that provides scan signals to the pixels; and
a controller that provides scan clock signals, inverted scan clock signals, and carry clock signals to the scan driver, wherein
the active stages are disposed within the display region, and
each of the active stages comprises:
    a first transistor that resets a control node in response to a frame start signal;
    a second transistor that transfers a previous carry signal to the control node;
    a third transistor that transfers a corresponding scan clock signal of the scan clock signals to a scan output node in response to a voltage of the control node;
    a first capacitor electrically connected between the control node and the scan output node;
    a fourth transistor that transfers a first low voltage to the scan output node in response to a corresponding inverted scan clock signal of the inverted scan clock signals;
    a fifth transistor that transfers a corresponding carry clock signal of the carry clock signals to a carry output node in response to the voltage of the control node;
    a sixth transistor that electrically connects the control node to the carry output node in response to the corresponding carry clock signal; and
    a seventh transistor that transfers a second low voltage to the control node in response to a next carry signal, wherein
the corresponding carry clock signal lags the corresponding scan clock signal by a delay time.

19. The display device of claim 18, wherein
the pixels includes:
    first pixel circuits electrically connected to a first scan line;
    second pixel circuits electrically connected to a second scan line;
    third pixel circuits electrically connected to a third scan line; and
    fourth pixel circuits electrically connected to a fourth scan line,
the first pixel circuits are located in a first pixel row and odd-numbered pixel columns of pixel columns,
the second pixel circuits are located in the first pixel row and even-numbered pixel columns of the pixel columns,
the third pixel circuits are located in a second pixel row and the odd-numbered pixel columns,
the fourth pixel circuits are located in the second pixel row and the even-numbered pixel columns,
a first active stage electrically connected to the first scan line among the active stages is located in the first pixel row and first through K-th pixel columns of the pixel columns, where K is an integer greater than 1,
a second active stage electrically connected to the second scan line among the active stages is located in the first pixel row and K+1-th through 2K-th pixel columns of the pixel columns,
a third active stage electrically connected to the third scan line among the active stages is located in the second pixel row and 2K+1-th through 3K-th pixel columns of the pixel columns, and
a fourth active stage electrically connected to the fourth scan line among the active stages is located in the second pixel row and 3K+1-th through 4K-th pixel columns of the pixel columns.

20. The display device of claim 18, wherein
the scan clock signals includes first, second, third, and fourth scan clock signals,
the inverted scan clock signals includes first, second, third and fourth inverted scan clock signals,
the carry clock signals includes first, second, third and fourth carry clock signals,
4L+1-th active stages of the active stages receive the first scan clock signal, the first inverted scan clock signal, and the first carry clock signal, and are located in first through K-th pixel columns of pixel columns, where L is an integer greater than or equal to 0, and K is an integer greater than 1,
4L+2-th active stages of the active stages receive the second scan clock signal, the second inverted scan clock signal and the second carry clock signal, and are located in K+1-th through 2K-th pixel columns of the pixel columns,
4L+3-th active stages of the active stages receive the third scan clock signal, the third inverted scan clock signal and the third carry clock signal, and are located in 2K+1-th through 3K-th pixel columns of the pixel columns, and
4L+4-th active stages of the active stages receive the fourth scan clock signal, the fourth inverted scan clock signal and the fourth carry clock signal, and are located in 3K+1-th through 4K-th pixel columns of the pixel columns.

* * * * *